US009975762B2

(12) United States Patent
Chu et al.

(10) Patent No.: US 9,975,762 B2
(45) Date of Patent: May 22, 2018

(54) STACKED SEMICONDUCTOR STRUCTURE AND METHOD OF FORMING THE SAME

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 659 days.

(21) Appl. No.: 13/916,148

(22) Filed: Jun. 12, 2013

(65) Prior Publication Data

US 2015/0251895 A1 Sep. 10, 2015

Related U.S. Application Data

(60) Provisional application No. 61/779,992, filed on Mar. 13, 2013.

(51) Int. Cl.
*B81B 7/00* (2006.01)
*B81C 1/00* (2006.01)
*H01L 27/06* (2006.01)

(52) U.S. Cl.
CPC .. *B81C 1/00238* (2013.01); *B81C 2203/0792* (2013.01)

(58) Field of Classification Search
USPC ........................................ 257/595; 438/107
See application file for complete search history.

(56) References Cited

U.S. PATENT DOCUMENTS

| 7,442,570 | B2 | 10/2008 | Nasiri et al. |
| 8,587,038 | B2 | 11/2013 | Kojima |
| 8,878,312 | B2 | 11/2014 | Hung et al. |
| 8,973,250 | B2 | 3/2015 | Jahnes et al. |
| 2009/0114016 | A1* | 5/2009 | Nasiri ................ G01C 19/5719 73/504.12 |
| 2013/0001710 | A1* | 1/2013 | Daneman ................ H01L 23/10 257/415 |

FOREIGN PATENT DOCUMENTS

| CN | 101171665 A | 4/2008 |
| CN | 102701136 A | 10/2012 |

* cited by examiner

*Primary Examiner* — Marvin Payen
*Assistant Examiner* — Vernon P Webb
(74) *Attorney, Agent, or Firm* — Slater Matsil, LLP

(57) ABSTRACT

A stacked semiconductor structure includes a first substrate. A multilayer interconnect is disposed over the first substrate. Metal sections are disposed over the multilayer interconnect. First bonding features are over the metal sections. A second substrate has a front surface. A cavity extends from the front surface into a depth D in the second substrate. A movable structure is disposed over the front surface of the second substrate and suspending over the cavity. The movable structure includes a dielectric membrane, metal units over the dielectric membrane and a cap dielectric layer over the metal units. Second bonding features are over the cap dielectric layer and bonded to the first bonding features. The second bonding features extend through the cap dielectric layer and electrically coupled to the metal units.

20 Claims, 22 Drawing Sheets

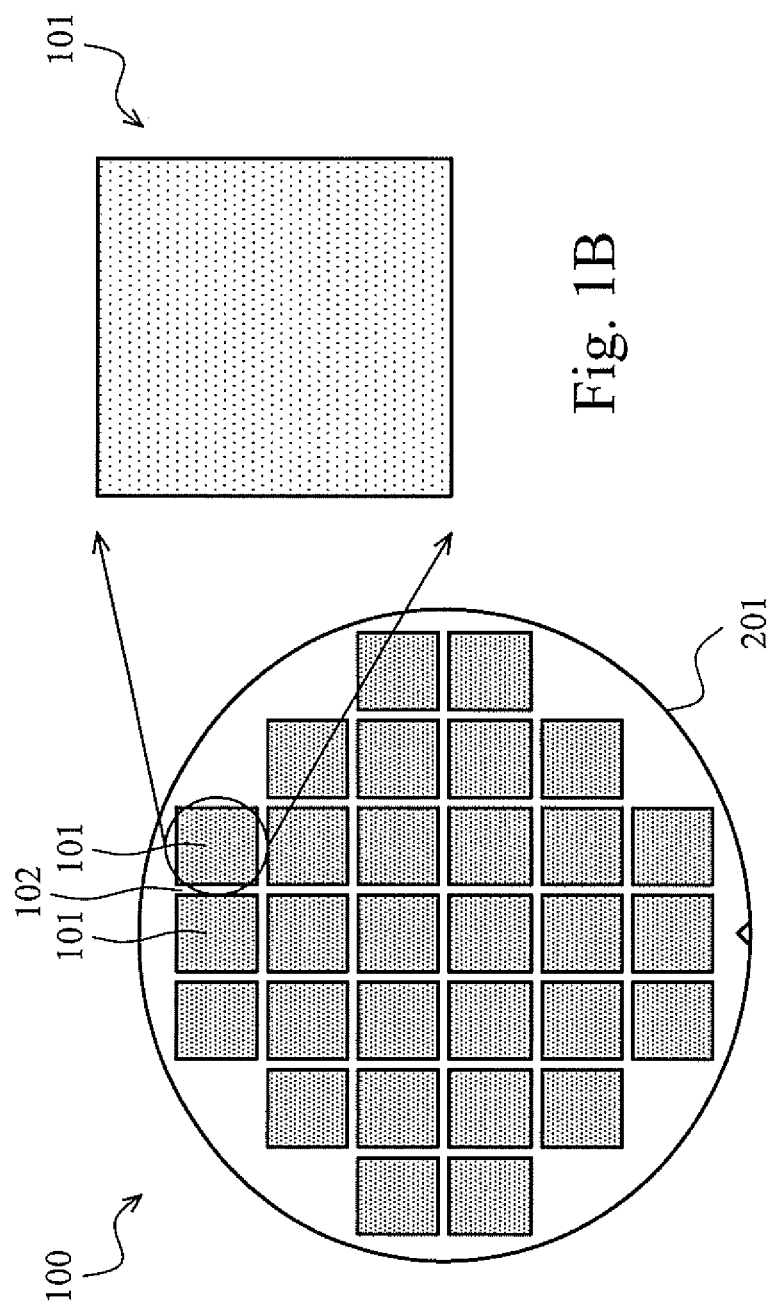

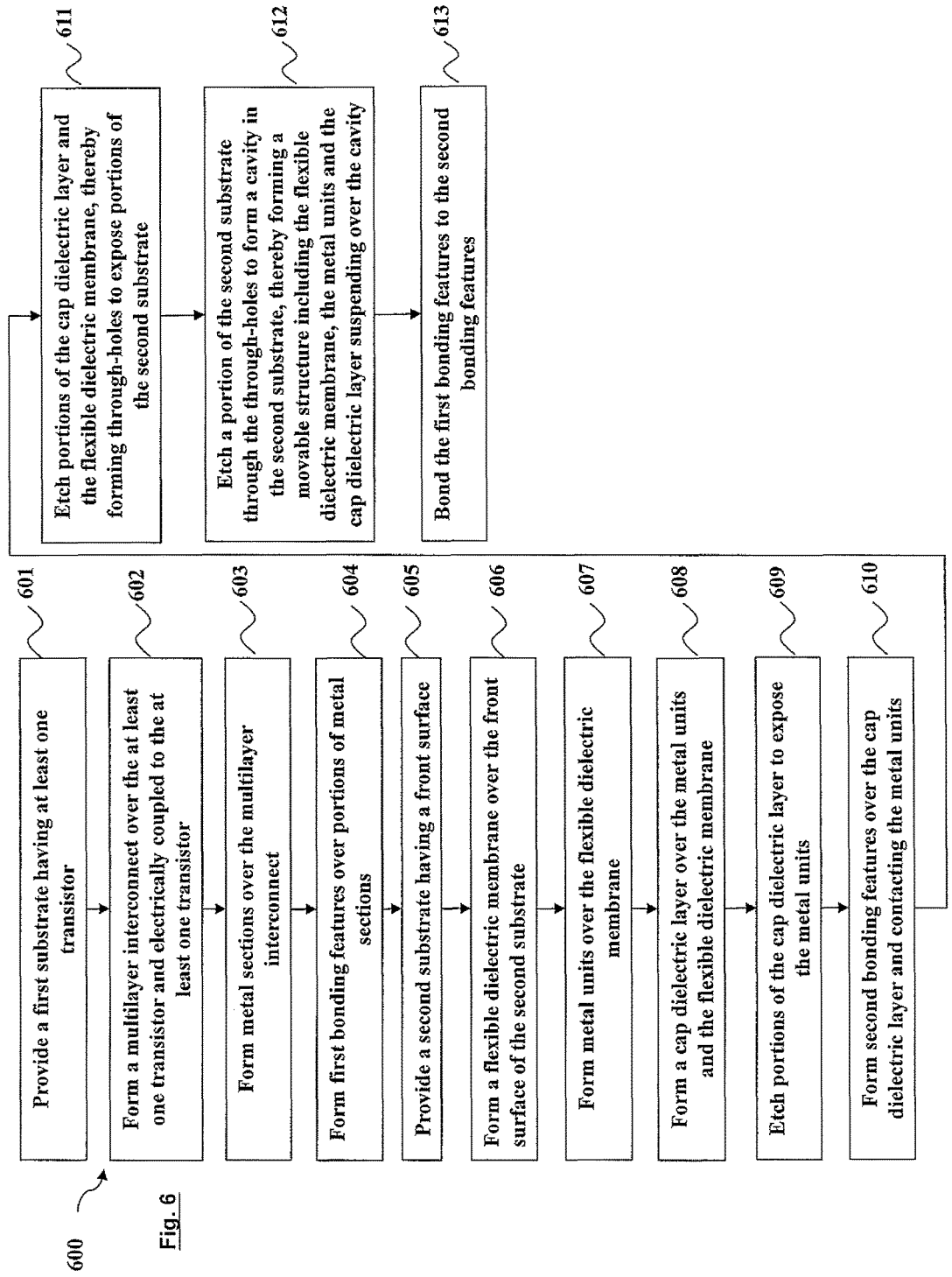

STACKED SEMICONDUCTOR STRUCTURE AND METHOD OF FORMING THE SAME

This application claims priority to U.S. Provisional Application Ser. No. 61/779,992, filed on Mar. 13, 2013, entitled "Stacked Semiconductor Structure and Method of Forming the Same," which application is hereby incorporated herein by reference.

This application is related to commonly assigned U.S. patent application Ser. No. 13/916,197, filed on the same date herewith, and entitled "Stacked Semiconductor Device and Method of Forming the Same," now U.S. Pat. No. 9,123,547, which application is incorporated herein by reference.

TECHNICAL FIELD

This disclosure relates generally to a stacked semiconductor structure and, more particularly, to a stacked semiconductor structure including a micro-electro-mechanical system (MEMS) device and a complementary metal-oxide-semiconductor (CMOS) device and methods for forming the stacked semiconductor structure.

BACKGROUND

A micro-electro-mechanical system (MEMS) device is a piece of technology with components on a very small scale. MEMS devices may have components within the micrometer size range and sometimes within the nanometer size range. A typical MEMS device may include processing circuitry as well as mechanical components for various types of sensors. MEMS applications include inertial sensors applications, such as motion sensors, accelerometers, and gyroscopes. Other MEMS applications include optical applications such as movable mirrors, RF applications such as RF switches and resonators, and biological sensing structures.

A demand for smaller ICs with higher performance has led to the development of stacked devices, where one of the stacked devices is dedicated to MEMS applications and other of the stacked devices is dedicated to logic or other types of CMOS circuitry. However, it can be difficult to manufacture a stacked semiconductor device with multiple types of function, due to integration problems of the different circuit fabrication technologies. Various techniques directed at configurations and fabrication methods of these stacked semiconductor devices including a MEMS device and a CMOS device have been implemented to try and further improve these integrated semiconductor devices' performances.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIG. 1A is a top view of a wafer including a plurality of MEMS chips on a substrate according to one or more embodiments of this disclosure.

FIG. 1B is an enlarged view of a single MEMS chip of FIG. 1A according to one or more embodiments of this disclosure.

FIG. 6 is a flowchart of a method of forming a stacked semiconductor structure including a MEMS device and a CMOS device according to at least one embodiment of this disclosure.

DETAILED DESCRIPTION

Figure 2A:
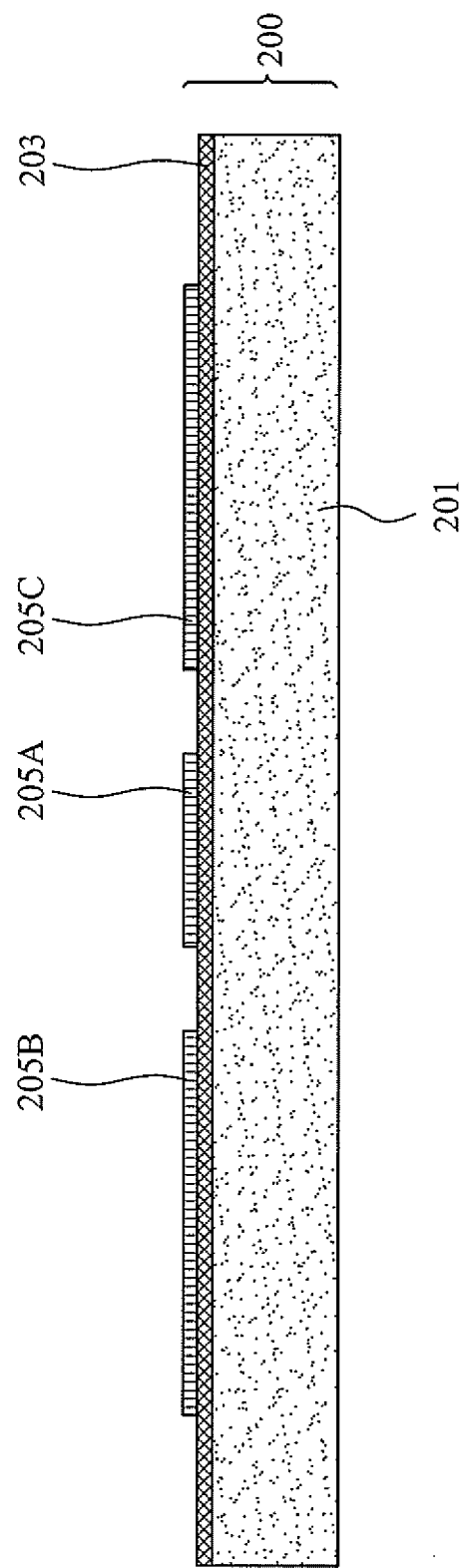
FIGS. 2A to 2H are cross-sectional views of a MEMS device in a stacked semiconductor structure at various stages of manufacture according to one or more embodiments of this disclosure.

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure. Further still, references to relative terms such as "top," "front," "bottom," and "back" are used to provide a relative relationship between elements and are not intended to imply any absolute direction. Various features may be arbitrarily drawn in different scales for simplicity and clarity.

According to one or more embodiments of this disclosure, a stacked semiconductor structure including a micro-electro-mechanical system (MEMS) device and a complementary metal-oxide-semiconductor (CMOS) device. The MEMS device includes a motion sensor (for example, a gyroscope or an accelerometer), a RF MEMS device (for example, a RF switch, resonator, or filter), a MEMS magnetometer, an optical MEMS device (for example, a MEMS micro-mirror), a MEMS oscillator, a MEMs microphone, and/or any other MEMS type device. The CMOS device includes a logic device, memory device (for example, a static random access memory (SRAM), radio frequency (RF) device, input/output (I/O) device, system-on-chip (SoC), other suitable type of device, or combinations thereof.

FIG. 1A is a top view of a wafer 100 including a plurality of MEMS chips 101 marked on a substrate 201 (also referred to as MEMS substrate 201). The plurality of MEMS chips 101 are divided by scribe lines 102 between the MEMS chips 101. FIG. 1B is an enlarged view of a single MEMS chip 101 depicted in FIG. 1A. According to one or more embodiments of this disclosure, at least one MEMS device is formed within a chip region 101 of the MEMS substrate 201. The MEMS substrate 201 will go through a variety of cleaning, depositing, patterning, etching, releasing and doping steps to form the at least one MEMS device as mentioned in the previous text. The term "substrate" herein generally refers to a bulk substrate on which various layers and MEMS structures are formed. In some embodiments, the bulk substrate includes silicon substrate, silicon-on-insulator (SOI) substrate or germanium substrate. Examples of such layers include dielectric layers, doped layers, polysilicon layers or conductive layers.

FIGS. 2A to 2H are cross-sectional views of a MEMS device 200 in a stacked semiconductor structure at various stages of manufacture according to various embodiments in this disclosure to form a stacked semiconductor structure. Additional processes may be provided before, during, or after the manufacture stages in FIGS. 2A to 2H. Various figures have been simplified for a better understanding of the inventive concepts of the present disclosure.

Referring to FIG. 2A, which is an enlarged cross-sectional view of a portion of a substrate 201 (also referred to as MEMS substrate 201) of a MEMS device 200.

In the embodiments in FIGS. 2A-2H, the MEMS device 200 is referred to a RF MEMS switch device. The RF MEMS switch device includes a flexible top electrode of a micro-machined capacitor. With the up- and down-state of the flexible top electrode of the capacitor, the capacitance of the RF MEMS switch device is variable as a switch to control the transmission of a RF signal. In the embodiments in FIGS. 2A-2H, the MEMS substrate 201 is referred to a silicon substrate. A dielectric layer 203 is formed on a top surface of the MEMS substrate 201. The dielectric layer 203 has a higher etching resistance than the MEMS substrate 201 in a following etching process to release the dielectric layer 203 from the top surface of the MEMS substrate 201. The details will be described in later text. In some examples, the dielectric layer 203 includes silicon oxide, silicon nitride or silicon oxy-nitride. In certain examples, the dielectric layer 203 has a thickness in a range from about 500 angstrom to about 1200 angstrom. The formation method of the dielectric layer 203 includes chemical vapor deposition (CVD), low pressure CVD (LPCVD), atmospheric pressure CVD (APCVD), plasma enhanced CVD (PECVD), or combinations thereof.

A metal layer is formed using various deposition processes, lithography patterning processes, etching processes or combination thereof to form metal segments 205A to 205C over the dielectric layer 203. In some examples, the metal layer includes aluminum, copper, aluminum/copper alloy, titanium, tantalum, tungsten, metal silicide, or combinations thereof. In certain examples, the metal segments 205A to 205C have a thickness in a range from about 3000 angstrom to about 7000 angstrom.

Figure 2B:
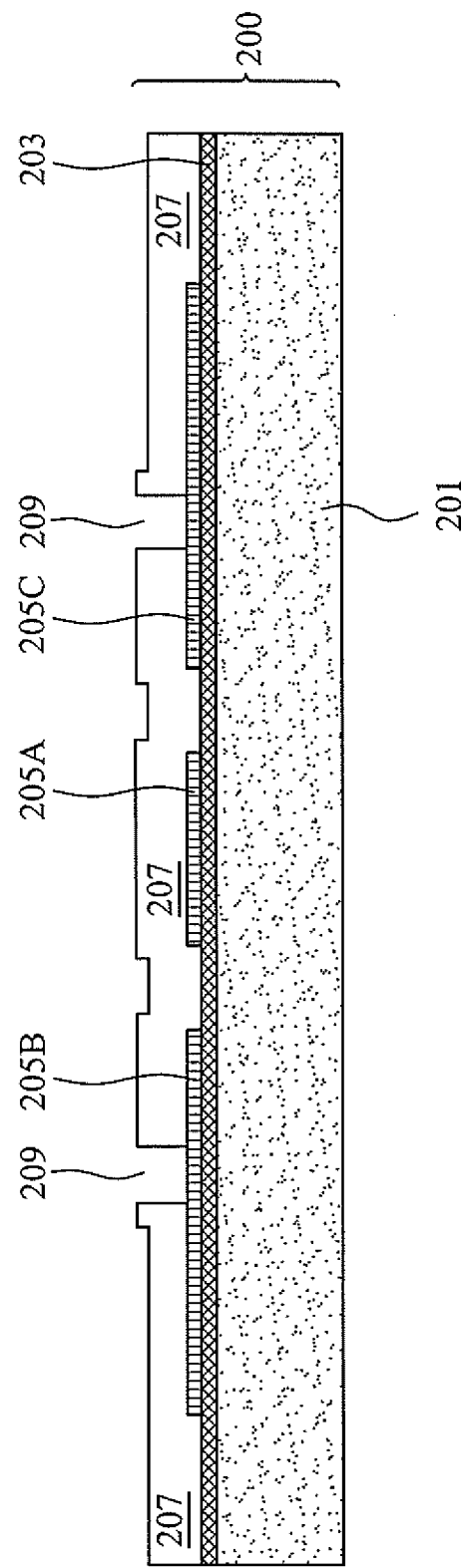

Referring to FIG. 2B, a dielectric layer 207 is formed over the metal segments 205A-205C and the dielectric layer 203. The dielectric layer 207 provides mechanical strength and rigidity to act as a flexible suspended membrane or beam for a movable structure in the MEMS device 200. The dielectric layer 207 is also referred to as dielectric membrane 207. In certain examples, the dielectric membrane 207 has a thickness in a range from about 0.5 micrometer to about 5 micrometer. The dielectric membrane 207 may include silicon oxide, silicon nitride, silicon oxy-nitride or any suitable materials. The formation method of the dielectric membrane 207 includes chemical vapor deposition (CVD), low pressure CVD (LPCVD), atmospheric pressure CVD (APCVD), plasma enhanced CVD (PECVD), or combinations thereof.

After the formation of dielectric membrane 207, openings 209 are formed in the dielectric membrane 207 to expose a portion of the metal segments 205B and 205C. The openings 209 are formed using various lithography patterning processes, etching processes including dry etching or wet etching.

Figure 2C:
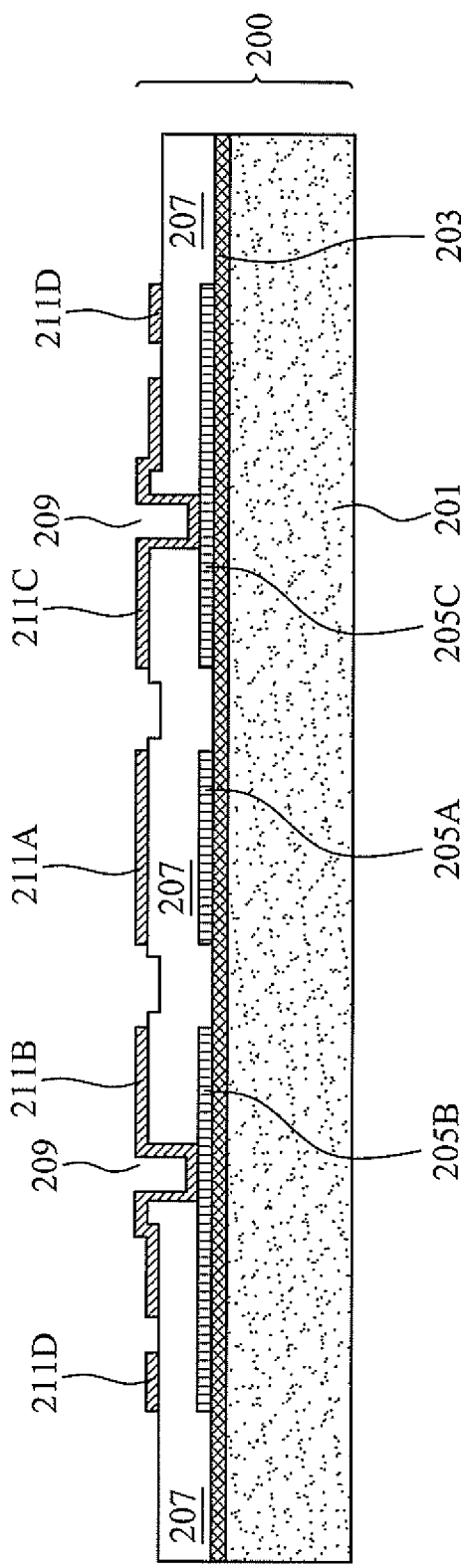

Referring to FIG. 2C, a metal layer is conformally formed on the dielectric membrane 207, along interior surface of the openings 209 and on the exposed portion of the metal segments 205B and 205C. The metal layer is patterned using various lithography patterning processes, etching processes or combination thereof to form metal units 211A to 211D over the dielectric membrane 207. In some examples, the metal units 211A to 211D include aluminum, copper, aluminum/copper alloy, titanium, tantalum, tungsten, gold, metal silicide, or combinations thereof. In certain examples, the metal units 211A to 211D have a thickness in a range from about 3000 angstrom to about 7000 angstrom.

The metal units 211A-211C are referred to as a top electrode in the MEMS device 200. The metal units 211B and 211C are on a portion of the dielectric membrane 207, along an interior surface of the openings 209 and on the exposed portion of the metal segments 205B and 205C, respectively. The metal units 211B and 211C configured to connect a power source from the MEMS device 200 are pull-down elements of the top electrode. The metal unit 211A is adjacent to the metal units 211B and 211C. The metal unit 211A separated from the metal units 211B and 211C by gaps is configured to transmit a signal of the MEMS device 200. The metal unit 211A is referred to as a signal element of the top electrode.

Figure 2D:
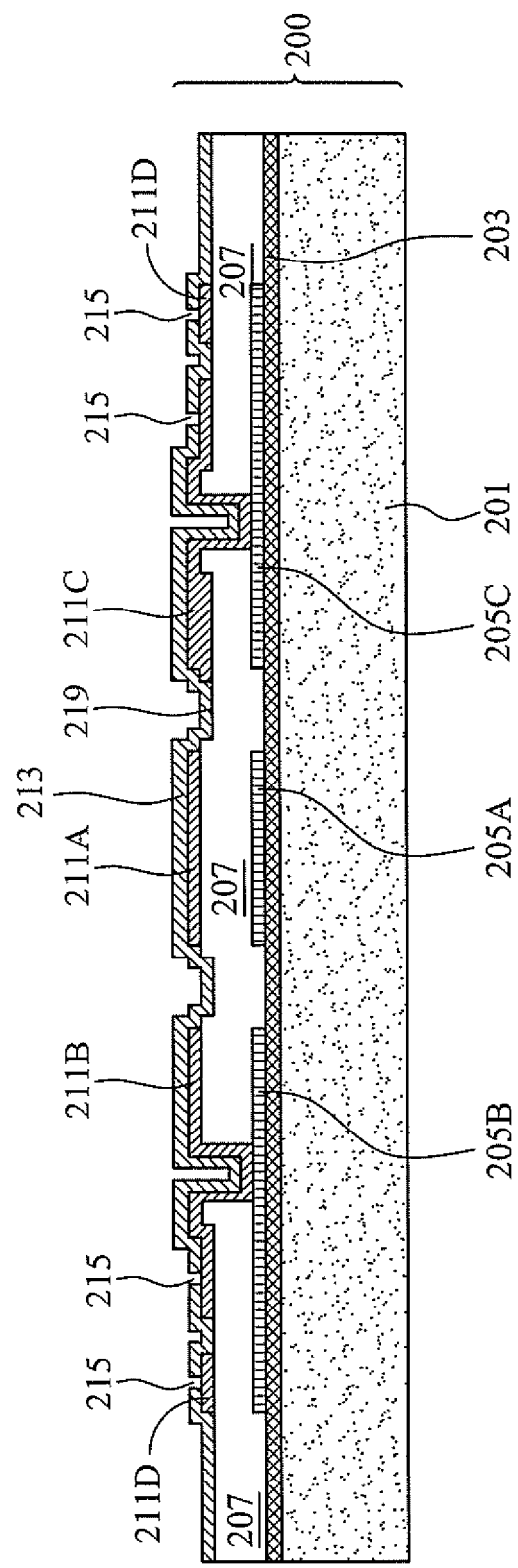

Referring to FIG. 2D, a cap dielectric layer 213 is conformally formed on the metal units 211A-211D, along the interior surface of the openings 209 and on the exposed portion of the dielectric membrane 207. The cap dielectric layer 213 may include silicon oxide, silicon nitride, silicon oxy-nitride or any suitable materials. In certain examples, the cap dielectric layer 213 has a thickness in a range from about 500 angstrom to about 1200 angstrom. The formation method of the cap dielectric layer 213 includes chemical vapor deposition (CVD), low pressure CVD (LPCVD), atmospheric pressure CVD (APCVD), plasma enhanced CVD (PECVD), or combinations thereof. The cap dielectric layer 213 may protect the underlying metal units 211A-211D or top electrode from damage in the following processes, such as bonding.

A plurality of vias 215 is formed in the cap dielectric layer 213 to expose a portion of the metal units 211B, 211C and 211D. The vias 215 are formed using various lithography patterning processes, etching processes including dry etching or wet etching.

Figure 2E:
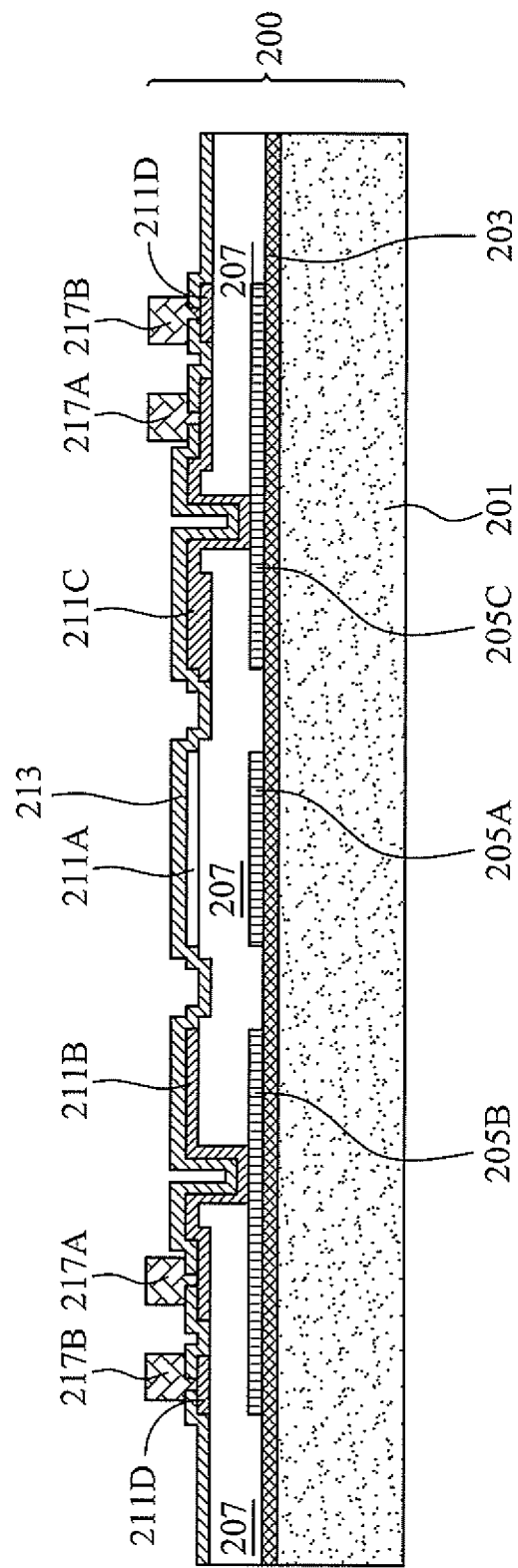

Referring to FIG. 2E, bonding features 217A and 217B are formed on portions of the cap dielectric layer 213, in the plurality of vias 215 and contacting the metal units 211B, 211C and 211D, respectively. The bonding features (217A and 217B) include a conductive material, such as a metal material or a semiconductor material. The metal material of the bonding features includes aluminum, copper or aluminum/copper alloy. The semiconductor material of the bonding features includes silicon or germanium. The bonding features (217A and 217B) are formed by depositing the conductive material on the patterned cap dielectric layer 213 and overfilling the vias 215, and then patterning the conductive material depending on design requirements of the MEMS device 200. The deposition process includes chemical vapor deposition (CVD), physical vapor deposition (PVD), plasma enhanced CVD (PECVD), low-pressure CVD (LPCVD), atomic layer CVD (ALCVD), atmospheric pressure CVD (APCVD), other deposition methods, or combinations thereof. The conductive material is patterned using lithography patterning processes, etching processes, other suitable processes, or combinations thereof.

The bonding features 217A contact the metal units 211B and 211C, respectively, configured to provide an electrical path from an external power source to pull-down elements of the top electrode (metal units 211B and 211C) of the MEMS device 200. The bonding features 217B are at an edge of the MEMS device 200 and form a closed loop seal ring surrounding the bonding features 217A, signal element of the top electrode (metal unit 211A), and pull-down elements of the top electrode (metal units 211B and 211C). The bonding features 217B is formed over the metal unit 211D. With the existence of the metal unit 211D, bonding features 217B is substantially coplanar to the bonding features 217A which is over the metal unit 211B or 211C. Due to the co-planarity of the bonding features 217A and the bonding features 217B, the MEMS device 200 is capable to having a better bonding interface and bonding strength with a CMOS device in the following bonding process.

Figure 2F:
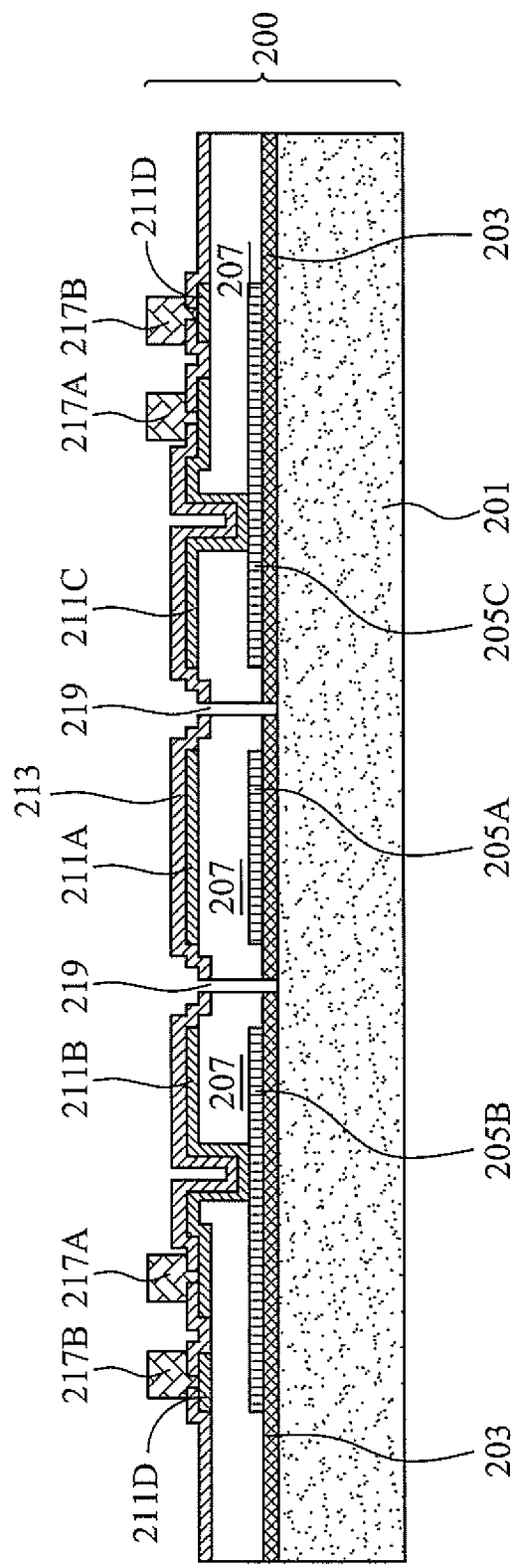

Referring to FIG. 2F, through-holes 219 are formed in the MEMS device 200 shown in FIG. 2E. The through-holes 219 extend through the cap dielectric layer 213, the dielectric membrane 207, the dielectric layer 203 and exposes portions of MEMS substrate 201. The through-holes 219 are formed using various lithography patterning processes, etching processes including dry etching or wet etching. In some examples, the through-holes 219 are formed in a dry etching process in an ambience including fluorine.

Figure 2G:
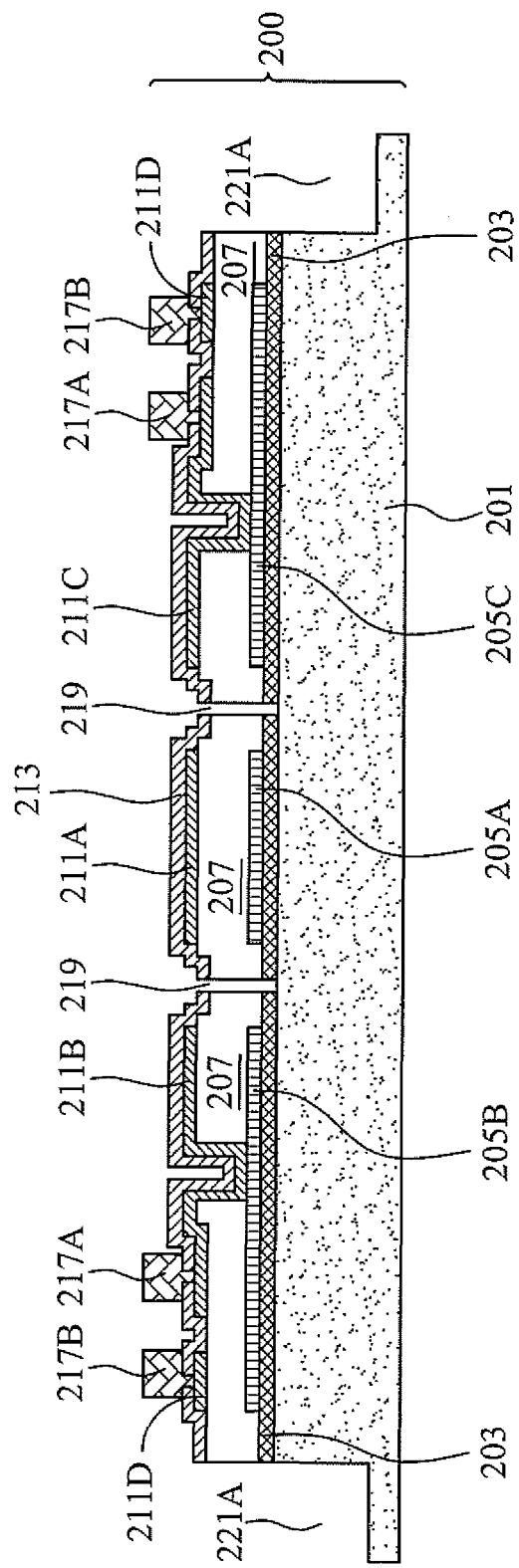

Referring to FIG. 2G, recesses 221A are formed at the edge of the MEMS device 200 shown in FIG. 2F. The recesses 221A are at outside of the bonding features 217B. The recesses 221A extend through the cap dielectric layer 213, the dielectric membrane 207, the dielectric layer 203 and portions of MEMS substrate 201. The recesses 221A are formed using various lithography patterning processes, etching processes including dry etching or wet etching.

Figure 2H:
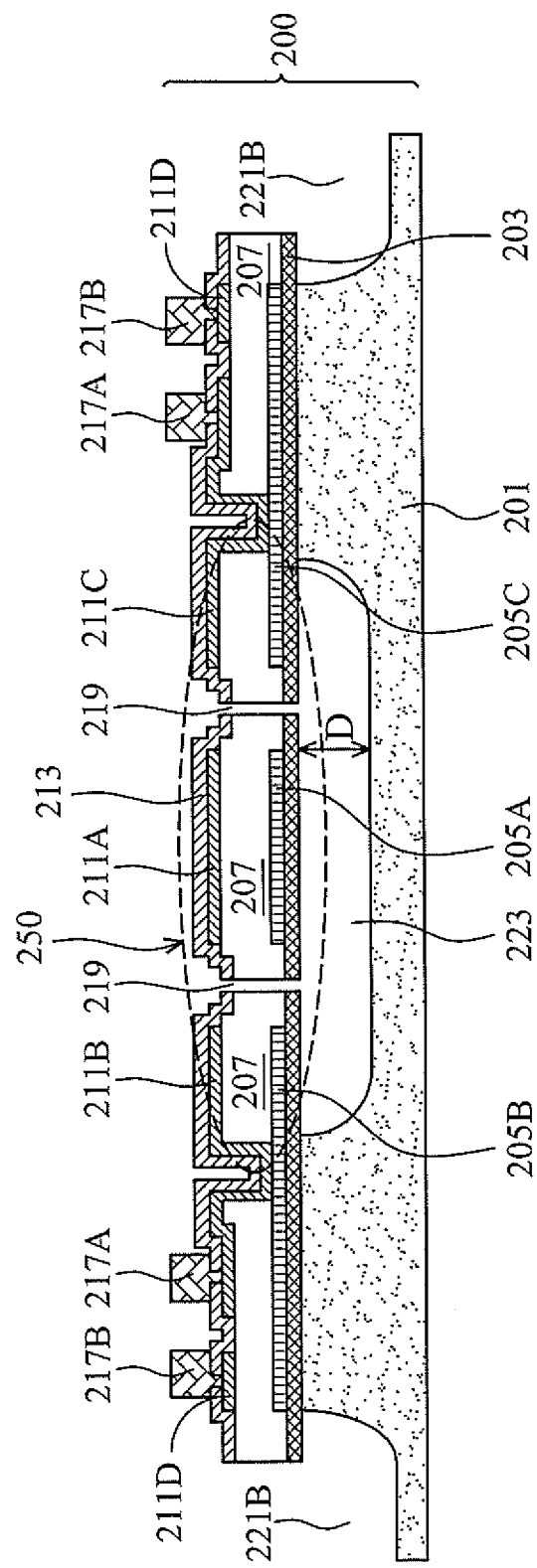

Referring to FIG. 2H, a cavity 223 is formed in the MEMS substrate 201 and recesses 221B are formed at the positions of recesses 221A shown in FIG. 2G. In some examples, a dry etching process in an ambience including fluorine is performed through the through-holes 219 and the recesses 221A to isotropic etch portions of the MEMS substrate 201 to form the cavity 223 and the recesses 221B. The dielectric layer 203, the dielectric membrane 207 and the cap dielectric layer 213 have a higher etching resistance than the MEMS substrate 201 in the etching process to form the cavity 223 and the recesses 221B. An etching selectivity of the MEMS substrate 201 relative to the dielectric layer 203, the dielectric layer 207 or the cap dielectric layer 213 is larger than 50.

After the formation of the cavity 223, a movable structure 250 is released from the MEMS substrate 201 and suspends over the cavity 223. The movable structure 250 includes the dielectric membrane 207 sandwiched by a movable top electrode (metal units 211A-211C) and the metal segments (205A-205C). The movable structure 250 further includes the cap dielectric layer 213 and the dielectric layer 203 on top and bottoms surfaces of the movable structure 250, respectively. The cavity 223 has a depth D from a bottom surface of the dielectric layer 203 to a bottom surface of the cavity 223. The depth D is larger than 1 micrometer to ensure the motion of the movable structure 250.

In embodiments in FIGS. 2A-2H, the movable structure 250 is a symmetrical structure with a metal layer (for example, the metal units 211A-211C or the metal segments 205A-205C) and a dielectric layer (for example, the cap dielectric layer 213 or the dielectric layer 203) disposed on each side of the dielectric membrane 207. The metal segments 205A-205C and the dielectric layer 203, which are over the bottom surface of the dielectric membrane 207, may balance the stress from the metal units 211A-211C and the cap dielectric layer 213, which are over the top surface of the dielectric membrane 207. Due to the stress balance in each side, the movable structure 250 may not bend upward or downward. In certain embodiments, the movable structure 250 is an asymmetrical structure with a metal layer (for example, the metal units 211A-211C) and a dielectric layer (for example, the cap dielectric layer 213) disposed only over the top surface of the dielectric membrane 207.

The dielectric layer 207 provides mechanical strength and rigidity to act as a suspended membrane or beam for the movable structure 250 in the MEMS device 200. In some examples, a ratio of the thickness of the dielectric membrane 207 to the thickness of the metal units 211A-211C or the metal segments 205A-205C is in a range from about 2 to about 7. In certain examples, a ratio of the thickness of the dielectric membrane 207 to the thickness of the dielectric layer 203 or the cap dielectric layer 213 is in a range from about 5 to about 70.

FIGS. 3A to 3E are cross-sectional views of a CMOS device 300 in a stacked semiconductor structure at various stages of manufacture according to various embodiments to form a stacked semiconductor structure. Additional processes may be provided before, during, or after the manufacture stages in FIGS. 3A to 3E. Various figures have been simplified for a better understanding of the inventive concepts of the present disclosure.

Similar to the MEMS device 200, the CMOS device 300 is formed within a chip region of a CMOS substrate as shown in FIGS. 1A and 1B. A plurality of CMOS chips are divided by scribe lines between the COMS chips in the CMOS substrate in a wafer form. The CMOS substrate will go through a variety of cleaning, depositing, patterning, etching, and doping steps to form the at least one CMOS device within a chip region. The CMOS device includes a logic device, memory device (for example, a static random access memory (SRAM), radio frequency (RF) device, input/output (I/O) device, system-on-chip (SoC), other suitable type of device, or combinations thereof. Various device structures may be formed in the CMOS device including transistors, resistors, and/or capacitors, which may be connected through an interconnect layer to additional integrated circuits.

Figure 3A:
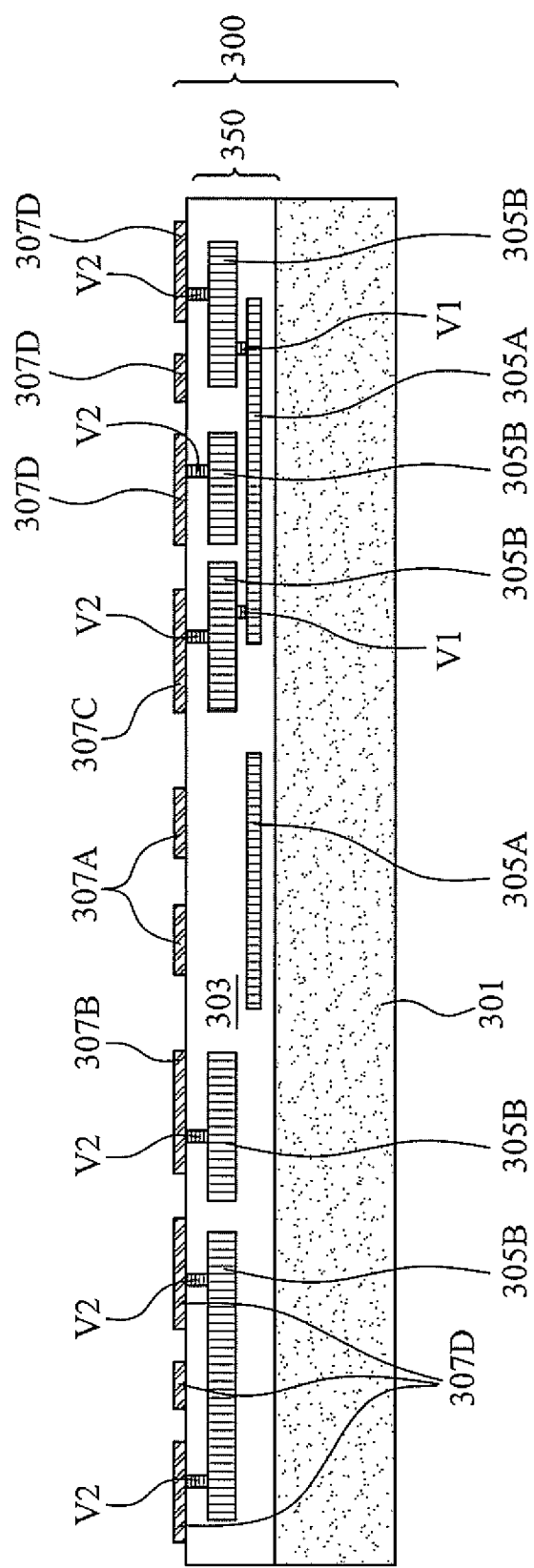
FIGS. 3A to 3E are cross-sectional views of a CMOS device in a stacked semiconductor structure at various stages of manufacture according to one or more embodiments of this disclosure.

Referring to FIG. 3A, which is an enlarged cross-sectional view of a portion of a CMOS device 300. The CMOS device 300 includes a substrate 301 (also referred to as CMOS substrate 301). In the depicted embodiment, the CMOS substrate 301 is a semiconductor substrate including silicon. Alternatively or additionally, the CMOS substrate 301 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 301 may be a semiconductor on insulator (SOI). The CMOS device 300 may further include various device structures (not shown) over the CMOS substrate 301. Various device structures may include transistors, resistors, and/or capacitors.

The CMOS device 300 further includes a multilayer interconnect (MLI) 350 disposed over a front surface of the CMOS substrate 301. The MLI 350 is coupled to various device structures or components of the CMOS device 300. The MLI 350 includes various conductive features, which may be vertical interconnects in different levels, such vias V1 and V2, and horizontal interconnects in different levels, such as lines 305A and 305B. The various conductive features in MLI 350 include aluminum, copper, aluminum/silicon/copper alloy, titanium, titanium nitride, tungsten, polysilicon, metal silicide, or combinations thereof. The conductive features in MLI 350 are formed by suitable process, including deposition, lithography patterning, and etching processes to form vertical and horizontal interconnects.

The various conductive features of the MLI 350 are disposed within an interlayer dielectric (ILD) layer 303. In some examples, The ILD layer 303 may have a multilayer structure. The ILD layer 303 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The formation process for ILD layer 303 includes chemical vapor deposition (CVD), PECVD, LPCVD, APCVD, other deposition methods, or combinations thereof.

Still referring to FIG. 3A, the CMOS device 300 further include a plurality of metal sections (307A-307D) formed on the ILD layer 303 and coupled to the MLI 350. The metal sections (307A-307D) are formed by suitable process, including deposition, lithography patterning, and etching processes. The metal sections (307A-307D) include conductive materials, such as aluminum, aluminum/silicon/copper alloy, titanium, titanium nitride, tungsten, gold, metal silicide, or combinations thereof.

In the depicted embodiment, the metal sections 307A-307C are referred to as a bottom electrode in the CMOS device 300. Corresponding to the pull-down elements of the top electrode (the metal units 211B and 221C) in the MEMS device 200, the metal sections 307B and 307C are pull-down elements of the bottom electrode which are configured to connect a power source from the CMOS device 300. Corresponding to the signal element of the top electrode (the metal unit 211A) in the MEMS device 200, the metal sections 307A in the CMOS device 300 are referred to as a signal element of the bottom electrode which are configured to transmit a signal cooperating with the top electrode (the metal unit 211A) of the MEMS device 200. The metal sections 307A are adjacent to the metal sections 307B and 307C. The metal sections 307A separated from the metal sections 307B and 307C by gaps. The metal sections 307D are configured to connect bonding features formed over the metal sections 307D in the following processes.

Figure 3B:
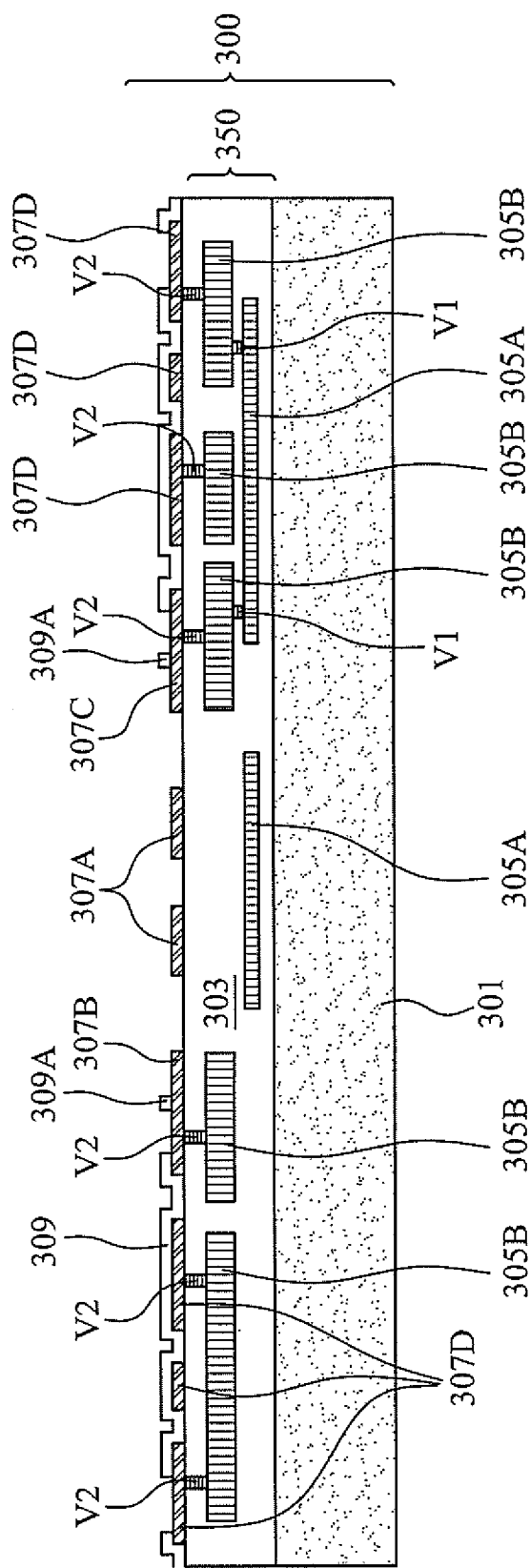

Referring to FIG. 3B, a dielectric layer 309 is formed on the metal sections (307A-307D) and the exposed ILD layer 303 of the CMOS device 300. The dielectric layer 309 includes silicon dioxide, silicon nitride, silicon oxynitride, TEOS oxide, PSG, BPSG, FSG, carbon doped silicon oxide, low-k dielectric material, or combinations thereof. Portions of the dielectric layer 309 are removed to form dielectric bumps 309A on the metal sections 307B and 307C (pull-down elements of the bottom electrode). Remaining portions of the dielectric layer 309 cover the metal sections 307D and expose a portion of the metal sections 307D.

Figure 3C:
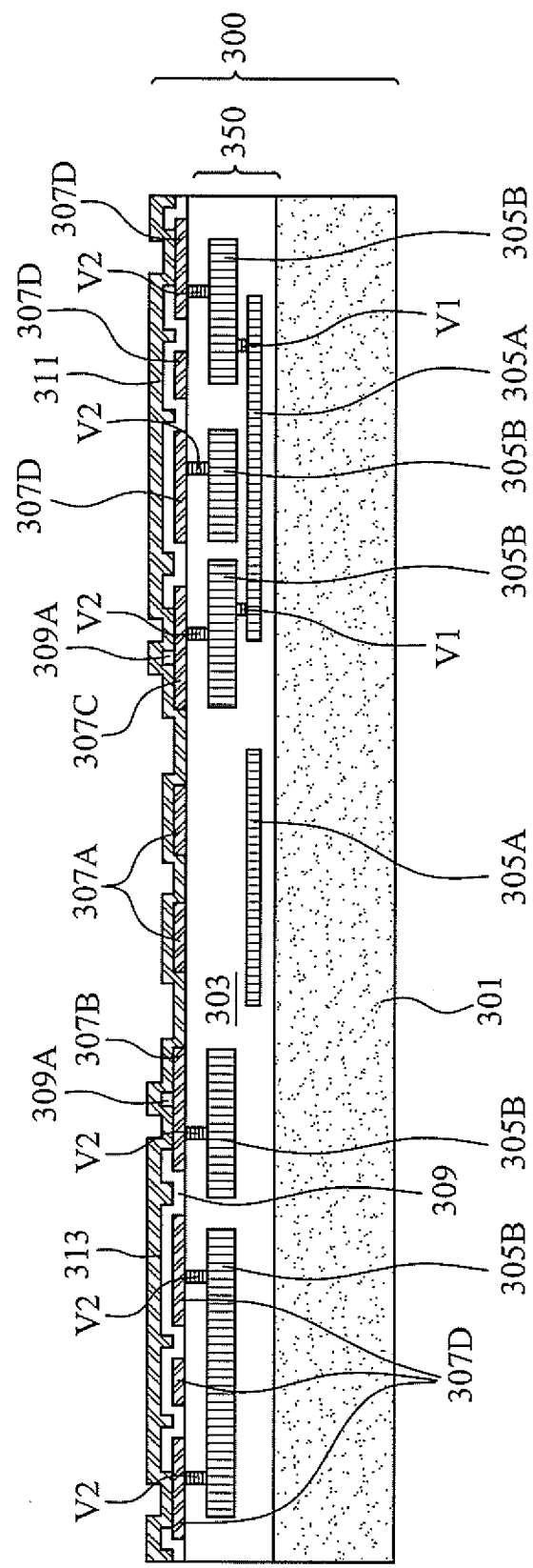

Referring to FIG. 3C, a protection dielectric layer 311 is formed on the CMOS device 300 shown in FIG. 3B. The protection dielectric layer 311 includes silicon dioxide, silicon nitride, silicon oxynitride, TEOS oxide, PSG, BPSG, FSG, carbon doped silicon oxide, low-k dielectric material, or combinations thereof. The protection dielectric layer 311 may protect the underlying metal sections (307A-307D) or bottom electrode from damage in the following processes, such as bonding. Since there is no dielectric bump 309A on the metal sections 307A, combined bumps composed of the dielectric bumps 309A and the protection dielectric layer 311 on the metal sections 307B and 307C have a height higher than a height of the protection dielectric layer 311 on the metal sections 307 alone. The combined bumps may withstand the pull-down elements of top electrode (metal units 211B and 211C) of the MEMS device 200 to touch the pull-down elements of bottom electrode (the metal sections 307B and 307C) of the CMOS device 300 during a moving operation of the stacked structure. The combined bumps may also provide a counterforce on the top electrode in the MEMS device 200 to prevent sticking on the bottom electrode in the CMOS device 300 if there is a residual electrostatic force between the top and bottom electrodes.

Figure 3D:
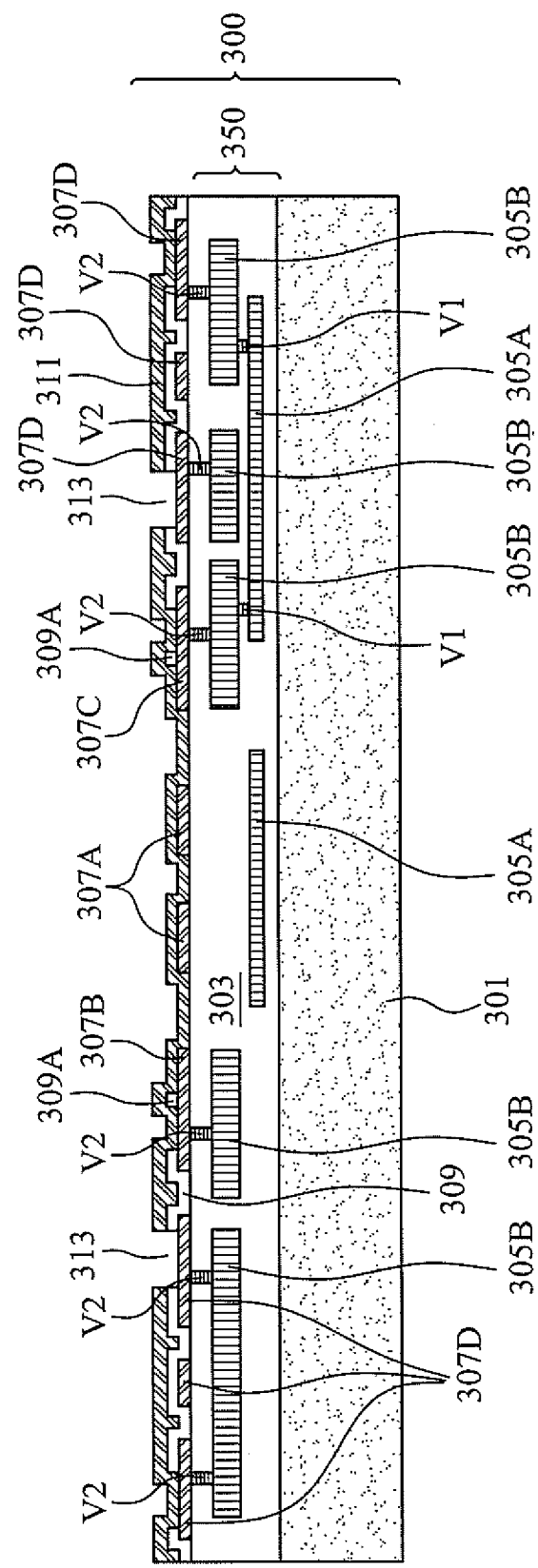

Referring to FIG. 3D, apertures 313 are formed extending through the protection dielectric layer 311 and the dielectric layer 309 to expose portions of the metal sections 307D. The apertures 313 are formed by suitable process, including lithography patterning and etching processes.

Figure 3E:
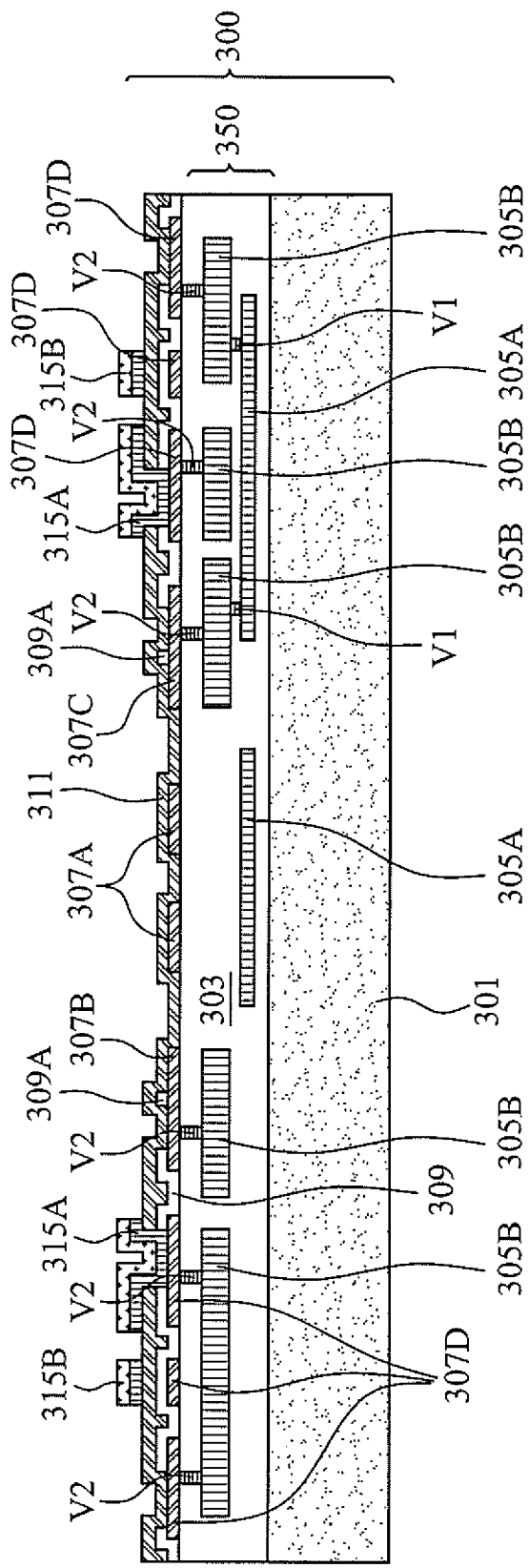

Referring to FIG. 3E, bonding features 315A-B are formed over the CMOS device 300 shown in FIG. 3D. The bonding features 315A are formed on portions of the protection dielectric layer 311, in apertures 313 and contacting the metal sections 307D. The bonding features 315A are configured to provide an electrical path from an external power source to pull-down elements of the top electrode of the MEMS device 200 through the bonding features 217A and the MLI 350. The bonding features 315B are formed on portions of the protection dielectric layer 311 at an edge of the CMOS device 300. The bonding features 315B form a closed loop seal ring surrounding the bonding features 315A, the signal element of the bottom electrode (metal sections 307A), and pull-down elements of the bottom electrode (metal sections 307B and 307C). The bonding features 315B are formed over the metal sections 307D. In some examples, bonding features 315A are substantially coplanar to the bonding features 315B.

The bonding features (315A and 315B) include a conductive material, such as a metal material or a semiconductor material. The metal material of the bonding features includes aluminum, copper or aluminum/copper alloy. The semiconductor material of the bonding features includes silicon or germanium. The bonding features (315A and 315B) are formed by depositing a conductive layer on the patterned protection dielectric layer 311 and overfilling the apertures 313, and then patterning the conductive layer depending on design requirements of the MEMS device 200. The deposition process of the conductive layer includes chemical vapor deposition (CVD), physical vapor deposition (PVD), plasma enhanced CVD (PECVD), low-pressure CVD (LPCVD), atomic layer CVD (ALCVD), atmospheric pressure CVD (APCVD), other deposition methods, or combinations thereof. The conductive layer is patterned using lithography patterning processes, etching processes, other suitable processes, or combinations thereof.

Figure 4A:
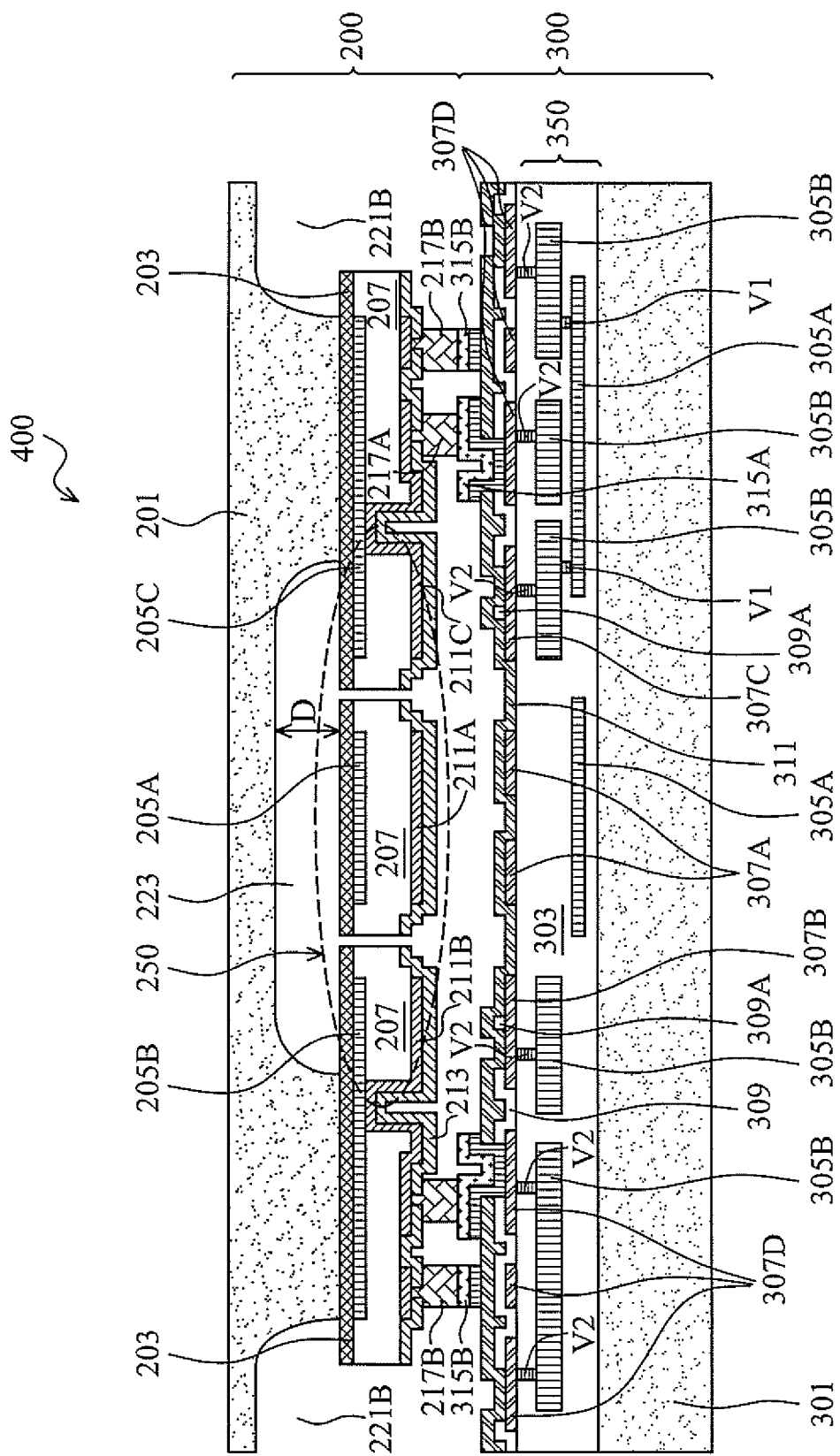
FIGS. 4A to 4B are cross-sectional views of a stacked semiconductor structure including a MEMS device and a CMOS device at various stages of manufacture according to one or more embodiments of this disclosure.
Figure 4B:
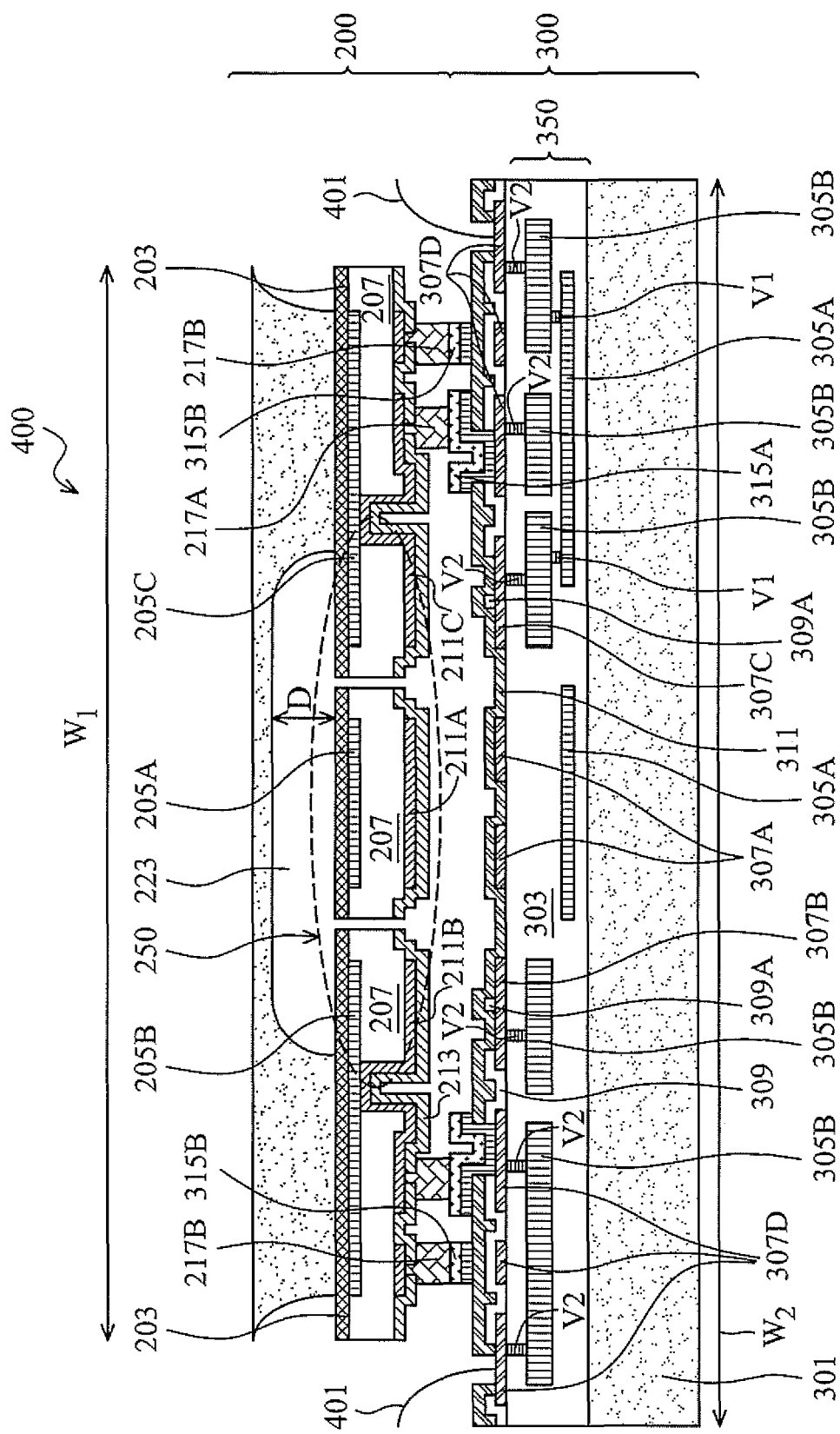

FIGS. 4A to 4B are cross-sectional views of a stacked semiconductor structure 400 including the MEMS device 200 and the CMOS device 300 at various stages of manufacture according to one or more embodiments of this disclosure.

Referring to FIG. 4A, the MEMS device 200 is bonded to the CMOS device 300 to form the stacked semiconductor structure 400. In the depicted embodiment, the bonding features 217A-B of the MEMS device 200 are bonded to the bonding features 315A-B of the CMOS device 300, respectively. The bonding features 217A contact the bonding features 315A, and cooperate with the bonding features 315A to electrically connect the MEMS device 200 and the CMOS device 300. The bonding features 217B contact the bonding features 315B, and cooperate with the bonding features 315B to form a closed loop combined seal ring. The closed loop combined seal ring surrounds the movable structure 250 (including the top electrode) of the MEMS device 200, the bottom electrode of the CMOS device 300, and bonding features 217A and 315A. The closed loop combined seal ring is located at the edge of the stacked semiconductor structure 400, and protects inner the top electrode and the bottom electrode from moisture or other chemicals in the following processes or in an operation of the stacked semiconductor structure 400. The movable structure 250 (including the top electrode) and the bottom electrode are sealed between the MEMS substrate 201 and the CMOS substrate 301. Due to the bonding features 217A-B and the bonding features 315A-B interposed between the MEMS device 200 and the CMOS device 300, the movable structure 250 is suspended over the front side of the CMOS device 300.

In certain examples, a eutectic bonding process is performed to bond the MEMS device 200 and the CMOS device 300. The eutectic bonding process is performed by heating two (or more) materials that are in contact such that the two (or more) materials diffuse together to form an alloy composition. Since the bonding features (217A-B and 315A-B) include a metal material or a semiconductor material, the eutectic bonding process may form a metal/metal bonding (for example, Al/Al bonding) interface or a metal/semiconductor material bonding (for example, Al/Ge bonding) interface.

Referring to FIG. 4B, after bonding processes, the MEMS substrate 201 in the stacked semiconductor structure 400 is thinned from a back surface opposite to the movable structure 250 of the MEMS substrate 201. In at least one embodiment, a planarization process, such as a chemical mechanical polishing (CMP) process, grinding, and/or chemical etching, is applied to the back surface of the MEMS substrate 201 to reduce a thickness of the MEMS substrate 201. In some embodiments, a portion of the MEMS substrate 201 above the recesses 221B as shown in FIG. 4A is removed after the thinning of the back surface of the MEMS substrate 201. Hence, a width $W_1$ of the thinned MEMS substrate 201 is less than a width $W_2$ of the CMOS substrate 301 in the stacked semiconductor structure 400. A plurality of the metal sections 307D near the edge of the CMOS device 300 extend beyond the edge of the MEMS device 200. The metal sections 307D near the edge of the CMOS device 300 are capable of forming electrical connection structures to an external circuit in the following processes.

After the thinning process, portions of the protection dielectric layer 311 are removed to expose the metal sections 307D near the edge of the CMOS device 300. Electrical connection structures 401 are formed over the metal sections 307D near the edge of the CMOS device 300 to connect to an external circuit. In some examples, the electrical connection structure 401 is a wire made by a wire bonding process as shown in FIG. 4B. In certain examples, the electrical connection structure 401 is a solder bump made by a bumping process. Accordingly, the stacked semiconductor structure 400 has been integrated with the MEMS device 200 and the CMOS device 300. Both the CMOS device 300 and the MEMS device 200 may electrically connect to an external circuit through electrical connection structure 401, the metal sections (307A-307D), the MLI 350, the bonding features 315A, the bonding features 217A and the metal units 211B-C.

An operation of the stacked semiconductor structure 400 including at least one RF MEMS switch device 200 is described as following. When the movable structure 250 (including the flexible top electrode) is at up-state, the capacitance between the top electrode in MEMS device 200 and the bottom electrode in the CMOS device 300 is "low". A RF signal transmitting in the metal sections 307A (signal element of the bottom electrode) goes all the way alone the metal sections 307A. The RF signal is in "on" state.

When a predetermined voltage is applied between the pull-down elements of the top electrode (metal units 211B-C) and the pull-down elements of the bottom electrode (metal sections 307B-C), the movable structure 250 (including the flexible top electrode) is pulled by an electrostatic force and collapses downward to the bottom electrode in "down" state. The signal element of the top electrode (metal units 211A) is pulled down until it conforms to the protection dielectric layer 311 over the signal element of the bottom electrode (metal sections 307A). The protection dielectric layer 311 and the cap dielectric layer 213 prevent the top electrode and the bottom electrode from being electrically shorted. The capacitance between the top electrode in MEMS device 200 and the bottom electrode in the CMOS device 300 is "high". The RF signal transmitting in the signal element of the bottom electrode (metal sections 307A) may shunt to the signal element of the top electrode (metal units 211A). The RF signal may not go all the way alone the metal sections 307A. The RF signal goes from the metal sections 307A in the bottom electrode to the metal units 211A in the top electrode. The RF signal is in "off" state. The movable top electrode in the MEMS device 200 is variable as a switch to control the transmission of the RF signal.

The combined bumps (the dielectric bumps 309A and the protection dielectric layer 311) may provide a counterforce on the top electrode in the MEMS device 200 to prevent the top electrode sticking on the bottom electrode in the CMOS device 300 if there is a residual electrostatic force between the top and bottom electrodes when the predetermined voltage is withdrawn.

FIGS. 5A to 5E are cross-sectional views of a stacked semiconductor structure 500 including the MEMS device 200 and the CMOS device 300 in a variation of manufacture stages of FIGS. 2A-2H, 3A-3E and 4A-4B. Some of the structures in FIGS. 5A to 5E may be substantially similar to the embodiments disclosed in FIGS. 2A-2H, 3A-3E and 4A-4B, and the description of the common structures are not repeated here although fully applicable in the following embodiments as well.

Figure 5A:
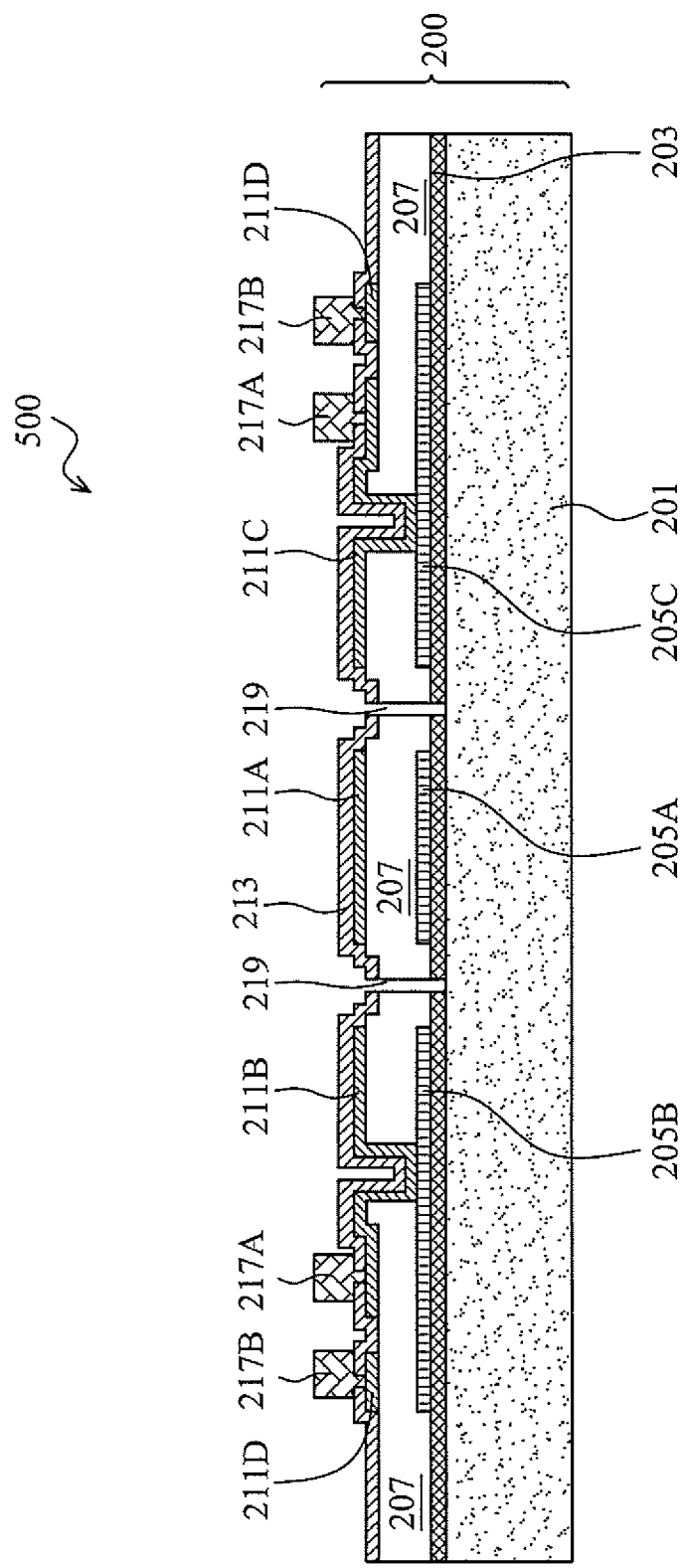
FIGS. 5A to 5E are cross-sectional views of a stacked semiconductor structure including a MEMS device and a CMOS device at various stages of manufacture according to some embodiments of this disclosure.

Referring to FIG. 5A, the stacked semiconductor structure 500 includes the MEMS device 200 as shown in FIG. 2F. Details of the materials and fabrication methods of the MEMS substrate 201, the dielectric layer 203, the metal segments 205A-C, the dielectric (membrane) layer 207, the metal units 211A-D, the cap dielectric layer 213, the bonding features 217A-B and the through-holes 219 can be found in the text associated with FIGS. 2A-2F and are not repeated here.

Figure 5B:
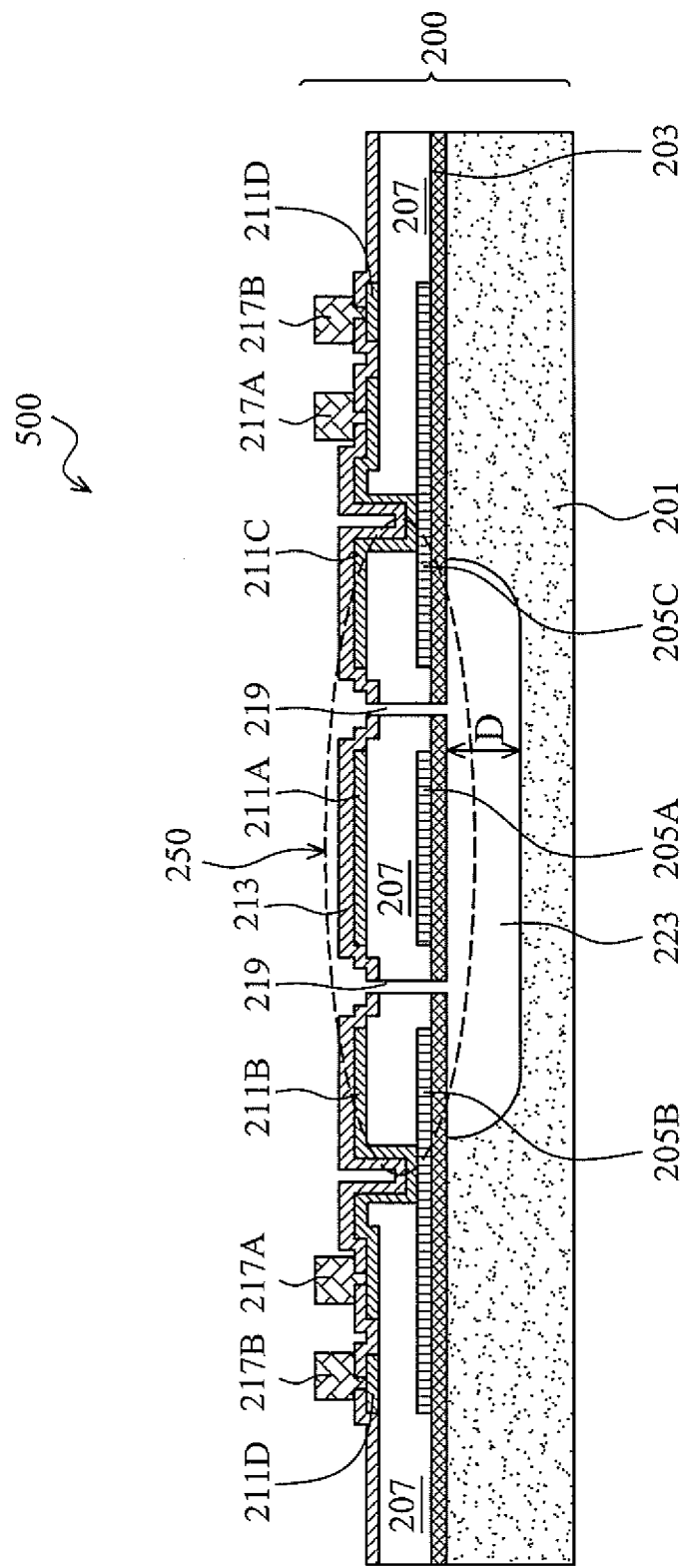

Referring to FIG. 5B, a cavity 223 is formed in the MEMS substrate 201 of the stacked semiconductor structure 500. In some examples, a dry etching process in an ambience including fluorine is performed through the through-holes 219 to isotropic etch portions of the MEMS substrate 201 to form the cavity 223. The dielectric layer 203, the dielectric (membrane) layer 207 and the cap dielectric layer 213 have a higher etching resistance than the MEMS substrate 201 in the etching process to form the cavity 223. An etching selectivity of the MEMS substrate 201 relative to the dielectric layer 203, the dielectric layer 207 or the cap dielectric layer 213 is larger than 50.

After the formation of the cavity 223, a movable structure 250 is released from the MEMS substrate 201 and suspends over the cavity 223. The movable structure 250 includes the dielectric membrane 207 sandwiched by a movable top electrode (metal units 211A-211C) and the metal segments (205A-205C). The movable structure 250 further includes the cap dielectric layer 213 and the dielectric layer 203 on top and bottoms surfaces of the movable structure 250, respectively. The cavity 223 has a depth D from a bottom surface of the dielectric layer 203 to a bottom surface of the cavity 223. The depth D is larger than 1 micrometer to ensure the motion of the movable structure 250.

In embodiment in FIG. 5B, the movable structure 250 is a symmetrical structure with a metal layer (for example, the metal units 211A-211C or the metal segments 205A-205C) and a dielectric layer (for example, the cap dielectric layer 213 or the dielectric layer 203) disposed on each side of the dielectric membrane 207. The metal segments 205A-205C and the dielectric layer 203, which are over the bottom surface of the dielectric membrane 207, may balance the stress from the metal units 211A-211C and the cap dielectric layer 213, which are over the top surface of the dielectric membrane 207. Due to the stress balance in each side, the movable structure 250 may not bend upward or downward. In certain embodiments, the movable structure 250 is an asymmetrical structure with a metal layer (for example, the metal units 211A-211C) and a dielectric layer (for example, the cap dielectric layer 213) disposed only over the top surface of the dielectric membrane 207.

The dielectric layer 207 provides mechanical strength and rigidity to act as a suspended membrane or beam for the movable structure 250 in the MEMS device 200. In some examples, a ratio of the thickness of the dielectric membrane 207 to the thickness of the metal units 211A-211C or the metal segments 205A-205C is in a range from about 2 to about 7. In certain examples, a ratio of the thickness of the dielectric membrane 207 to the thickness of the dielectric layer 203 or the cap dielectric layer 213 is in a range from about 5 to about 70.

Figure 5C:
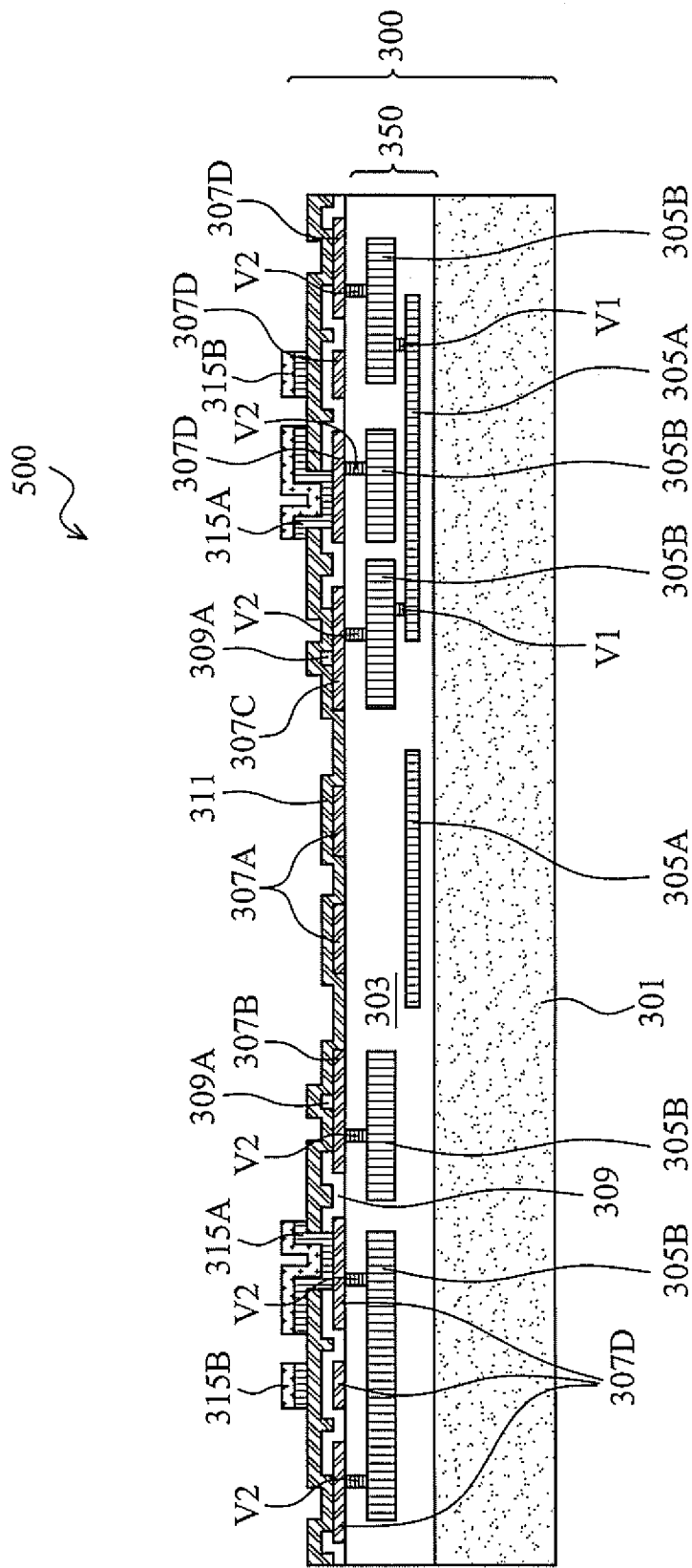

Referring to FIG. 5C, the stacked semiconductor structure 500 includes the CMOS device 300 as shown in FIG. 3E. Details of the materials and fabrication methods of the CMOS substrate 301, the ILD layer 303, the MLI 350, the lines 305A-B, the vias V1-V2, the metal sections 307A-D, the dielectric layer 309, the dielectric bumps 309A, the protection dielectric layer 311 and the bonding features 315A-B can be found in the text associated with FIGS. 3A-3E and are not repeated here.

Figure 5D:
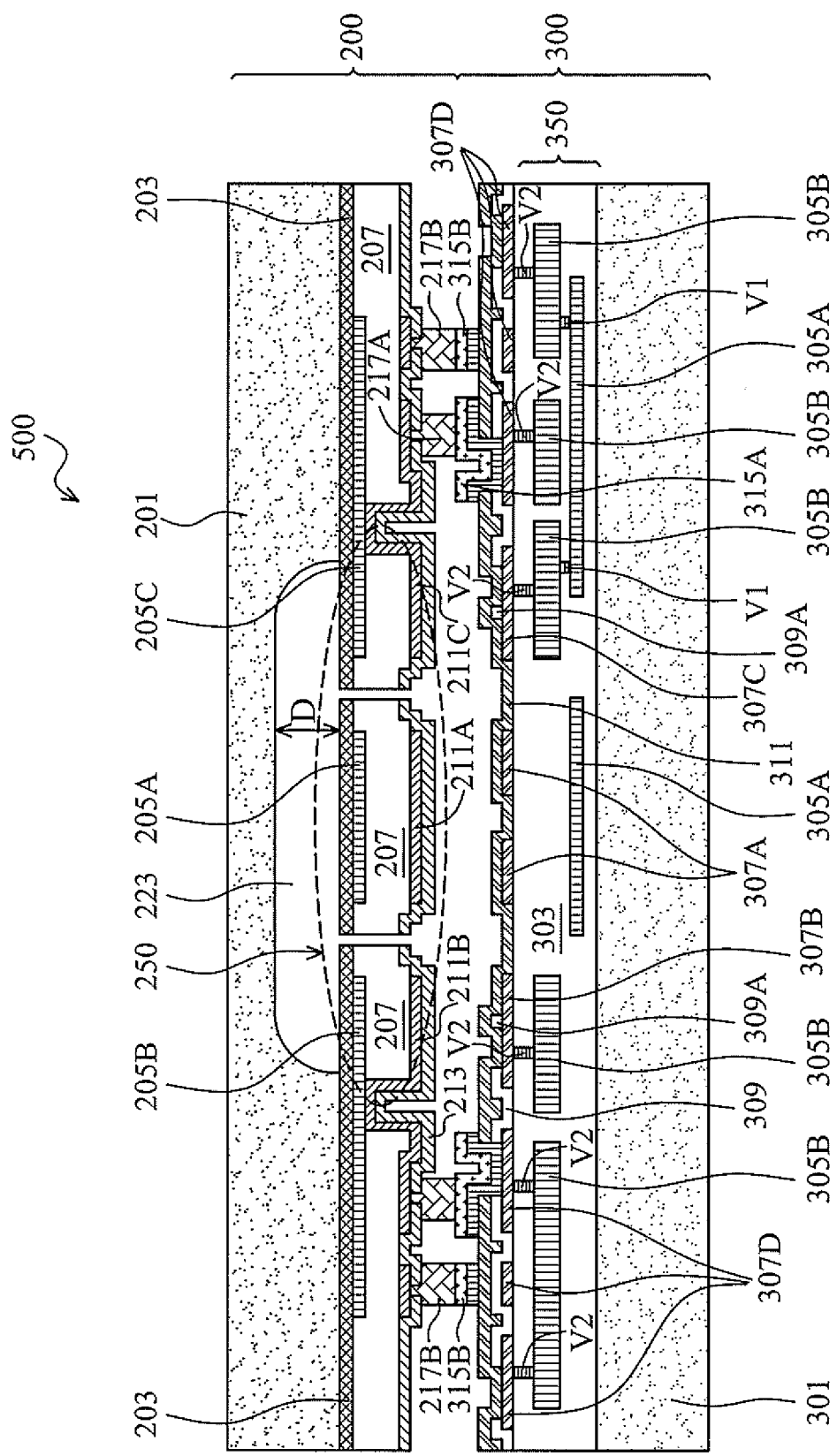

Referring to FIG. 5D, the MEMS device 200 is bonded to the CMOS device 300 to form the stacked semiconductor structure 500. In the depicted embodiment, the bonding features 217A-B of the MEMS device 200 are bonded to the bonding features 315A-B of the CMOS device 300, respectively. The bonding features 217A contact the bonding features 315A, and cooperate with the bonding features 315A to electrically connect the MEMS device 200 and the CMOS device 300. The bonding features 217B contact the bonding features 315B, and cooperate with the bonding features 315B to form a closed loop combined seal ring. The closed loop combined seal ring surrounds the movable structure 250 (including the top electrode) and the bottom electrode of the MEMS device 200 and the CMOS device 300. The closed loop combined seal ring is located at the edge of the stacked semiconductor structure 500, and protects inner the top electrode and the bottom electrode from moisture or other chemicals in the following processes or in an operation of the stacked semiconductor structure 500. The movable structure 250 (including the top electrode) and the bottom electrode are sealed between the MEMS substrate 201 and the CMOS substrate 301. Due to the bonding features 217A-B and the bonding features 315A-B interposed between the MEMS device 200 and the CMOS device 300, the movable structure 250 is suspended over the front side of the CMOS device 300.

Figure 5E:
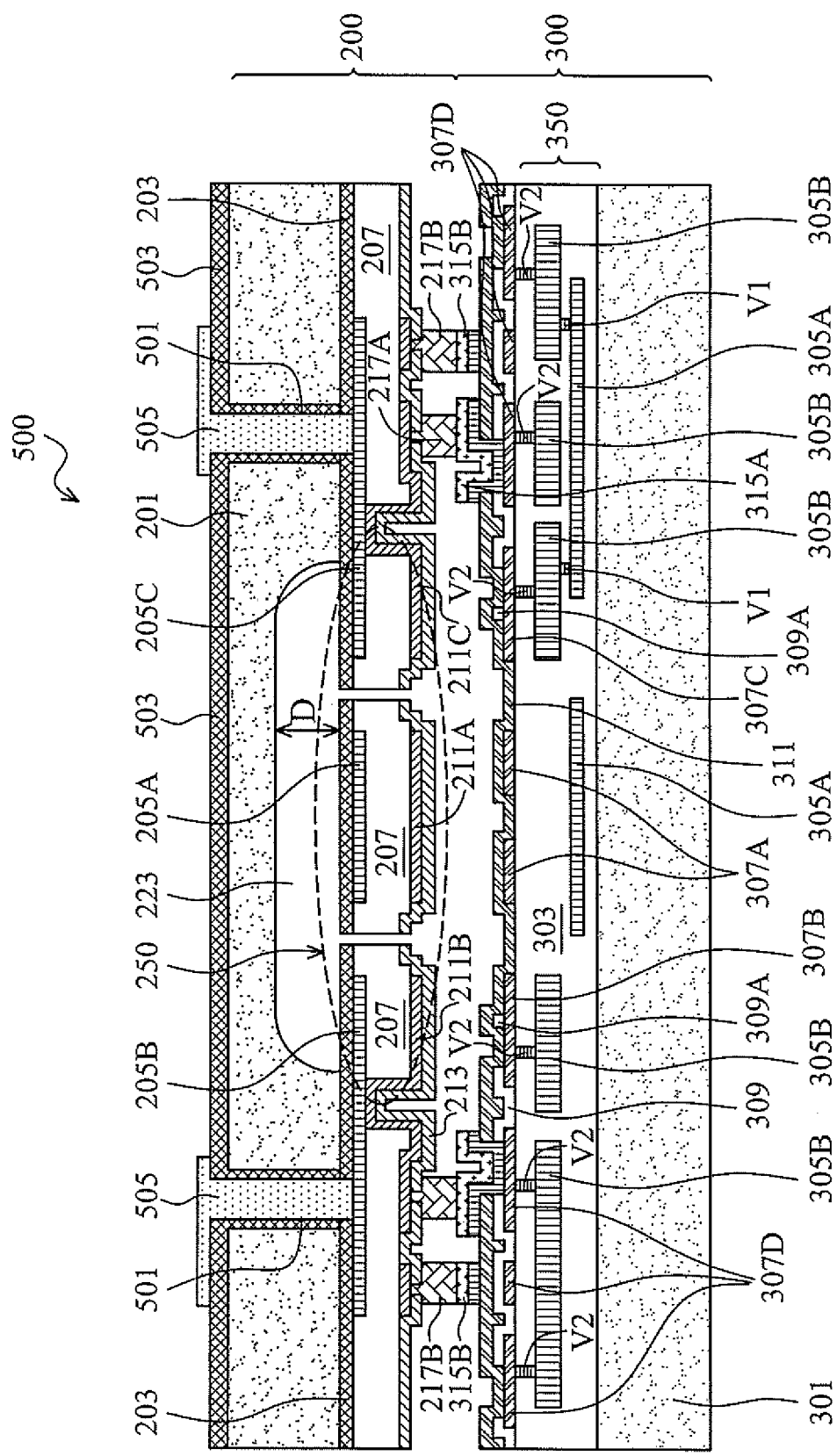

Referring to FIG. 5E, after bonding processes, through substrate vias (TSVs) 505 are formed within substrate 201, extending from the back surface opposite to the movable structure 250 of the MEMS substrate 201 to portions of metal segments 205B and 205C, respectively. As such, TSVs 505 provide both internal and external electrical connections for the stacked semiconductor structure 500. The TSVs 505 include an insulation layer 501 formed along sidewalls of TSVs 505 and over the back surface of substrate 201. The TSV 505 may also include a metal trace over the insulation layer 501 over the back surface of substrate 201. The metal trace may bond to a solder ball or a conductive bump to provide the external electrical connection to the metal segments 205B-C and the metal units 211B-C of the MEMS device 200. Furthermore, the metal trace may provide the external electrical connection to CMOS device 300 through the TSV 550, the metal segments 205B-C, the metal units 211B-C, the bonding features 217A, the bonding features 315A, the metal sections (307A-307D) and the MLI 350. Accordingly, the stacked semiconductor structure 500 has been integrated with the MEMS device 200 and the CMOS device 300, thereby providing a device to minimize and stabilize undesirable electrical parasitics at a low assembly cost.

In some examples, through substrate holes are formed in the MEMS substrate 201 using lithography patterning processes and etching processes to expose portions of metal segments 205B and 205C. The insulation layer 501 are formed on sidewalls of the through substrate holes and over the back surface MEMS substrate 201. The insulation layer 501 includes silicon oxide, silicon nitride or silicon oxynitride. The through substrate holes are overfilled with a conductive material and the excess conductive material is removed, and then the conductive material is patterned to form TSVs 505 depending on design requirements of the MEMS device 200. The conductive material of the TSVs 505 includes aluminum, copper or aluminum/copper alloy. The formation methods of the conductive material include electroless plating, sputtering, printing, electro plating, PVD or CVD. In at least one embodiment, a planarization process, such as a chemical mechanical polishing (CMP) process grinding, and/or chemical etching, is applied to the back surface of the MEMS substrate 201 to reduce a thickness of the MEMS substrate 201 before the through substrate holes are formed.

FIG. 6 is a flowchart of a method 600 of forming a stacked semiconductor structure including a MEMS device and a CMOS device according to at least one embodiment of this disclosure. FIGS. 2A-2H, 3A-3E, 4A-4B and 5A-5E are cross-sectional views of a stacked semiconductor structure including a MEMS device and a CMOS device at various stages of manufacture according to various embodiments of the method 600 of FIG. 6. Additional processes may be provided before, during, or after the method 600 of FIG. 6.

Referring now to FIG. 6, the flowchart of the method 600 begins with operation 601. At operation 601, a first substrate (for example, CMOS substrate) has at least one transistor disposed over the first substrate. At operation 602, a multilayer interconnect is formed over the at least one transistor and electrically coupled to the at least one transistor. At operation 603, metal sections are formed over the multilayer interconnect. At operation 604, first bonding features are formed over portions of metal sections. At operation 605, a second substrate (for example, MEMS substrate) having a front surface is provided. At operation 606, a flexible dielectric membrane is formed over the front surface of the second substrate. At operation 607, metal units are formed over the flexible dielectric membrane. At operation 608, a cap dielectric layer is formed over the metal units and the flexible dielectric membrane. At operation 609, portions of the cap dielectric layer are etched to expose the metal units. At operation 610, second bonding features are formed over the cap dielectric layer and contact the metal units. At operation 611, portions of the cap dielectric layer and the flexible dielectric membrane are etched thereby forming through-holes to expose portions of the second substrate. At operation 612, a portion of the second substrate is etched through the through-holes to form a cavity in the second substrate, thereby forming a movable structure including the flexible dielectric membrane, the metal units and the cap dielectric layer suspending over the cavity. At operation 613, the first bonding features are bonded to the second bonding features.

One aspect of the disclosure describes a stacked semiconductor structure. A first substrate has at least one transistor disposed over the first substrate. A multilayer interconnect is disposed over the at least one transistor and is electrically coupled to the at least one transistor. Metal sections are disposed over the multilayer interconnect. First bonding features are over the metal sections. A second substrate has a front surface. A cavity extends from the front surface into a depth D in the second substrate. A movable structure is disposed over the front surface of the second substrate and suspending over the cavity. The movable structure includes a dielectric membrane over the front surface, metal units over the dielectric membrane and a cap dielectric layer over the metal units. Second bonding features are over the cap dielectric layer and bonded to the first bonding features. The second bonding features extend through the cap dielectric layer and electrically coupled to the metal units.

A further aspect of the disclosure describes a stacked semiconductor structure. The stacked semiconductor structure includes a CMOS device and a MEMS device. The CMOS device includes a first substrate. A multilayer interconnect is disposed over the first substrate. A bottom electrode is disposed over the multilayer interconnect. First bonding features are over the bottom electrode. The MEMS device includes a second substrate having a front surface. A cavity extends from the front surface into a depth D in the second substrate. A flexible dielectric membrane is disposed over the front surface of the second substrate and suspending over the cavity. The flexible dielectric membrane has a thickness in a range from about 0.5 micrometer to about 5 micrometer. A top electrode is disposed over the flexible dielectric membrane. A cap dielectric layer is disposed over the top electrode. Second bonding features are over the cap dielectric layer and bonded to first bonding features. The top electrode and the bottom electrode construct a capacitor having a variable capacitance.

The present disclosure also describes a method of forming a stacked semiconductor structure. A first substrate has at least one transistor disposed over the first substrate. A multilayer interconnect is formed over the at least one transistor and electrically coupled to the at least one transistor. Metal sections are formed over the multilayer interconnect. First bonding features are formed over portions of metal sections. A second surface having a front surface is provided. A flexible dielectric membrane is formed over the front surface of the second substrate. Metal units are formed over the flexible dielectric membrane. A cap dielectric layer is formed over the metal units and the flexible dielectric membrane. Portions of the cap dielectric layer are etched to expose the metal units. Second bonding features are formed over the cap dielectric layer and contact the metal units. Portions of the cap dielectric layer and the flexible dielectric membrane are etched thereby forming through-holes to expose portions of the second substrate. A portion of the second substrate is etched through the through-holes to form a cavity in the second substrate, thereby forming a movable structure including the flexible dielectric membrane, the metal units and the cap dielectric layer suspending over the cavity. The first bonding features are bonded to the second bonding features.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A stacked semiconductor structure comprising:
    a first substrate having at least one transistor disposed over the first substrate;
    a multilayer interconnect disposed over the at least one transistor and electrically coupled to the at least one transistor;
    metal sections disposed over the multilayer interconnect;
    first bonding features over the metal sections;
    a second substrate having a bottom surface, the second substrate comprising silicon or germanium;
    a first dielectric layer disposed on the bottom surface of the second substrate;
    a cavity extending from a surface of the first dielectric layer into a depth D of the silicon or germanium of the second substrate, wherein top and side surfaces of the cavity comprise the silicon or germanium of the second substrate;
    a movable structure as a continuous unit disposed between the second substrate and the multilayer interconnect, the movable structure including a first portion of a cap dielectric layer, a first portion of a metal units layer in contact with the first portion of the cap dielectric layer, and a dielectric membrane in contact with the first portion of the metal units layer; and
    second bonding features on a second portion of the cap dielectric layer, the second bonding features bonded to the first bonding features, wherein the second bonding features extend through the second portion of the cap dielectric layer and electrically connect to a second portion of the metal units layer.

2. The stacked semiconductor structure of claim 1, wherein the movable structure further comprises metal segments on the dielectric membrane opposite to the first portion of the metal units layer, the metal segments being interposed between the dielectric membrane and the second substrate.

3. The stacked semiconductor structure of claim 2, wherein the movable structure further comprises the first dielectric layer between the metal segments and the second substrate.

4. The stacked semiconductor structure of claim 1, wherein the first portions of the metal units layer of the movable structure and portions of the metal sections construct a micro-machined capacitor with a variable capacitance.

5. The stacked semiconductor structure of claim 1, wherein the first substrate has a width $W_2$ wider than a width $W_1$ of the second substrate.

6. The stacked semiconductor structure of claim 1, further comprising:
through substrate vias (TSVs) extending from a top surface of the second substrate through the second substrate to electrically connect to the second portion of the metal units layer.

7. The stacked semiconductor structure of claim 1, further comprising:
a seal ring composed of a portion of the bonded first bonding features and second bonding features, wherein the seal ring surrounds the first portion of the metal units layer and the metal sections.

8. The stacked semiconductor structure of claim 1, wherein a ratio of a thickness of the dielectric membrane to a thickness of the first portion of the metal units layer is in a range from about 2 to about 7.

9. The stacked semiconductor structure of claim 1, wherein the first portion of the metal units layer and the metal sections include at least one signal element and at least one pull-down element adjacent to the at least one signal element, the at least one signal element and the at least one pull-down element separated by a gap.

10. The stacked semiconductor structure of claim 9 further comprising a dielectric bump disposed over the at least one pull-down element of the metal sections.

11. A stacked semiconductor structure comprising:
a CMOS device, the CMOS device comprising:
a first substrate;
a multilayer interconnect disposed over the first substrate;
a bottom electrode disposed over the multilayer interconnect, the bottom electrode comprising a first segment and a second segment;
a protection dielectric layer disposed over and in contact with the bottom electrode, the protection dielectric layer having a first extension extending vertically further from the first segment of the bottom electrode than vertically from the second segment of the bottom electrode; and
first bonding features over the bottom electrode; and
a MEMS device, the MEMS device comprising:
a second substrate having a lower surface;
a cavity extending upward from the lower surface into a depth D in the second substrate, surfaces of the cavity within the depth D comprising silicon or germanium substrate material;
a flexible dielectric membrane interposed between the second substrate and the CMOS device and suspended under the cavity, the flexible dielectric membrane having a thickness in a range from about 0.5 micrometers to about 5 micrometers;
a top electrode disposed on the flexible dielectric membrane;
a cap dielectric layer disposed on the top electrode; and
second bonding features interposed between the cap dielectric layer and the first bonding features, the second bonding features bonded to the first bonding features, wherein the top electrode and the bottom electrode construct a capacitor having a variable capacitance.

12. The stacked semiconductor structure of claim 11, further comprising metal segments on the flexible dielectric membrane opposite to the top electrode, and the metal segments being between the flexible dielectric membrane and the second substrate.

13. The stacked semiconductor structure of claim 12, further comprising a dielectric layer between the metal segments and the second substrate.

14. The stacked semiconductor structure of claim 11, further comprising a seal ring composed of a portion of the bonded first bonding features and second bonding features, the seal ring surrounding the top electrode and the bottom electrode.

15. The stacked semiconductor structure of claim 11, wherein a ratio of a thickness of the flexible dielectric membrane to a thickness of the top electrode is in a range from about 2 to about 7.

16. The stacked semiconductor structure of claim 11, further comprising a dielectric bump disposed over the first segment of the bottom electrode and under the protection dielectric layer.

17. The stacked semiconductor structure of claim 11, wherein each of the top electrode and the bottom electrode comprises aluminum, copper, aluminum/copper alloy, titanium, tantalum, tungsten, metal silicide, or combinations thereof.

18. A stacked semiconductor structure comprising:
a first substrate having a front surface;
a first dielectric layer disposed on the first substrate;
a plurality of metal segments disposed on the first dielectric layer;
a dielectric membrane on the first dielectric layer and the plurality of metal segments, the dielectric membrane comprising at least one opening exposing at least a portion of one of the plurality of metal segments;
a plurality of metal units disposed on the dielectric membrane and on a bottom surface and sidewalls of the at least one opening;
a cap dielectric layer disposed over the dielectric membrane and the plurality of metal units, the cap dielectric layer comprising at least one via disposed therein, the via exposing a portion of one of the plurality of metal units;
a first connection feature disposed over the via and electrically connected to the exposed portion of the one of the plurality of metal units;
a moveable unit comprising:
a first portion of the first dielectric layer,
a first portion of the plurality of metal segments disposed on the first portion of the first dielectric layer,
a first portion of the dielectric membrane disposed on the first portion of the first dielectric layer and the first portion of the plurality of metal segments,
a first portion of the plurality of metal units disposed on the first portion of the dielectric membrane, and
a first portion of the cap dielectric layer disposed over the first portion of the dielectric membrane and first portion of the plurality of metal units;

a first cavity extending from the front surface of the first substrate into a depth D in the first substrate, the first cavity extending laterally under a portion of the first dielectric layer;

a CMOS device comprising a second connection feature disposed on a first surface of the CMOS device, the second connection feature being bonded to the first connection feature; and a second cavity comprising the first cavity and a space formed between the CMOS device and the cap dielectric layer, the moveable unit suspended in the second cavity.

19. The stacked semiconductor structure of claim 18, wherein the CMOS device further comprises:

a multilayer interconnect interposed between the first substrate and a second substrate;

metal sections interposed between the multilayer interconnect and the first substrate;

a second dielectric layer on the metal sections and the multilayer interconnect, openings in the second dielectric layer exposing at least a portion of the metal sections;

a protection dielectric on the second dielectric layer and the metal sections; and an aperture in the protection dielectric and the second dielectric layer, the aperture exposing a portion of the metal sections, the second connection feature disposed on the protection dielectric and within the aperture.

20. The stacked semiconductor structure of claim 18, further comprising recesses in the first substrate at each end of the first substrate, the recesses extending under a portion of the first dielectric layer.

* * * * *